United States Patent [19]
Sawada et al.

[11] Patent Number: 5,490,110
[45] Date of Patent: Feb. 6, 1996

[54] NON-VOLATILE SEMICONDUCTOR MEMORY DEVICE HAVING DISTURB VERIFY FUNCTION

[75] Inventors: Kikuzo Sawada; Yoshikazu Sugawara, both of Tokyo, Japan

[73] Assignee: Nippon Steel Corporation, Tokyo, Japan

[21] Appl. No.: 307,252

[22] Filed: Sep. 16, 1994

Related U.S. Application Data

[63] Continuation-in-part of Ser. No. 232,996, Apr. 25, 1994, which is a continuation-in-part of Ser. No. 216,874, Mar. 23, 1994, which is a continuation-in-part of Ser. No. 112,997, Aug. 30, 1993.

[30] Foreign Application Priority Data

| Aug. 31, 1992 | [JP] | Japan | 4-255608 |
| Aug. 31, 1992 | [JP] | Japan | 4-255609 |
| Aug. 31, 1992 | [JP] | Japan | 4-255610 |
| Mar. 25, 1993 | [JP] | Japan | 5-092571 |
| Apr. 26, 1993 | [JP] | Japan | 5-122015 |

[51] Int. Cl.$^6$ .................................................. G11C 16/04
[52] U.S. Cl. .............................. 365/185.03; 365/185.12; 365/185.22
[58] Field of Search ................................. 365/185, 184, 365/218, 900, 195, 196

[56] References Cited

U.S. PATENT DOCUMENTS

| 4,575,823 | 3/1986 | Fitzpatrick | 365/184 |
| 4,698,787 | 10/1987 | Mukberjee | 365/185 |
| 5,077,691 | 12/1991 | Haddad et al. | 365/185 |
| 5,109,361 | 4/1992 | Yim et al. | 365/218 |
| 5,122,985 | 6/1992 | Santin | 365/185 |

FOREIGN PATENT DOCUMENTS 3-219496  12/1991  Japan.

OTHER PUBLICATIONS

Yasushi Terada, Flash Memory Technology and Its Future, ICD 91-134, 1991.

Primary Examiner—David C. Nelms
Assistant Examiner—Vu A. Le
Attorney, Agent, or Firm—Pollock, Vande Sande & Priddy

[57] ABSTRACT

The electrically rewritable nonvolatile semiconductor memory device includes a plurality of memory cells arranged in rows and columns, a decoder circuit for selecting at least one of the plurality of memory cells, a writing circuit for writing data in the selected memory cell through the decoder circuit, a reading circuit for reading the data from the selected memory cell, a detecting circuit for detecting a change of the threshold voltage of each of the non-selected memory cells, which change is caused by a voltage applied to the non-selected memory cell when writing the data in the selected memory cell, and a restoring circuit for restoring the threshold voltage of the non-selected memory cell a value equal to or near to its original value on the basis of the result of the above detection.

16 Claims, 21 Drawing Sheets

NON-VOLATILE SEMICONDUCTOR MEMORY DEVICE HAVING DISTURB VERIFY FUNCTION

CROSS-REFERENCE TO RELATED APPLICATIONS

This application is a continuation-in-part of U.S. patent application Ser. No. 08/232,996 filed on Apr. 25, 1994, which is a continuation-in-part of U.S. patent application Ser. No. 08/216,874 filed on Mar. 23, 1994, which is a continuation-in-part of U.S. patent application Ser. No. 08/112,997 filed on Aug. 30, 1993. The contents of U.S. patent application Ser. No. 08/232,996 are incorporated herein by reference.

BACKGROUND OF THE INVENTION

1. Field of the Invention

This invention relates to an electrically writable and non-volatile semiconductor memory device or an electrically writable/erasable non-volatile semiconductor memory device.

2. Description of the Related Art

Document 1: "SINGLE TRANSISTOR ELECTRICALLY PROGRAMMABLE MEMORY DEVICE AND METHOD", U.S. Pat. No. 4,698,787, Oct. 6, 1987.

Document 2: "FLASH EEPROM ARRAY WITH NEGATIVE GATE VOLTAGE ERASE OPERATION", U.S. Pat. No. 5,077,691, Dec. 31, 1991.

Document 3: "CIRCUIT AND METHOD FOR ERASING EEPROM MEMORY ARRAYS TO PREVENT OVER-ERASED CELLS", U.S. Pat. No. 5,122,985, Jun. 16, 1992.

Document 4: "NON-VOLATILE SEMICONDUCTOR MEMORY DEVICE", Japanese Patent Application Kokai No. JP-A-3-219496.

Document 5: "PRESENT SITUATION AND PROSPECT OF FLASH MEMORY", ICD 91–134, 1991.

The nonvolatile semiconductor memory device includes an ultraviolet erase type EPROM (Erasable and Programmable Read Only Memory) and an electrically writable/erasable (hereinafter, referred to as "electrically alterable") EEPROM (Electrically Erasable and Programmable Read Only Memory). In addition, an electrically erasable flash EEPROM has recently been developed. The data stored in the cells of the EPROM can be erased by ultraviolet ray but cannot be electrically erased. Thus the package for the EPROM is required to have a transparent window. In addition, in order to rewrite after it is mounted on a board of a system, it must be once disconnected from the board. This operation is troublesome. The EEPROM is electrically alterable as mounted in a system, but the memory cell generally needs a transistor or a channel region for selective isolation. Thus the area of the memory cell is about twice larger than the EPROM. In order to solve this problem, a flash type EEPROM which is electrically erasable and has a memory cell area equal to that of the EPROM has been developed.

The flash type EEPROM developed in the early stage is described in, for example, the document 1. The document 1 describes a method of electrically writing and erasing and a device structure, using a single memory transistor having a floating gate. In the erasing operation, a high voltage of 10 to 20 volts (V) is applied to the source terminal of the memory cell and a ground potential to the control gate terminal. A high electric field is generated in a thin insulating film between the floating gate and the source terminal. By the Fowler-Nordheim tunneling phenomenon (hereinafter, referred to as "FN injection") electrons are discharged from the floating gate so that the threshold voltage of the memory cell as viewed from the control gate can be reduced. In the writing operation, a voltage of 5 to 10 V is applied to the drain terminal of the memory cell, a high voltage of 10 to 15 V to the control gate, and the source terminal is grounded, thus generating a strongly inverted region on the substrate surface between the drain and source. As a result, hot electrons (hereinafter, referred to as "HE injection") are generated and thus electrons are injected into the floating gate so that the threshold voltage of the memory cell can be increased.

The document 2 and the document 3, pages 4 to 5 describes another erasing method in which a negative voltage (for example, −7 V to −15 V) is applied to the control gate of the memory cell and a power source voltage (for example, 5 V) or ground potential to the source terminal, thus electrons being discharged from the floating gate by the FN injection. In this method, as disclosed in the document 1, a high voltage (for example, 10 to 20 V) is not necessary to be applied to the source terminal and hence a low voltage can be used when rewriting. Also in this method, since the control gate of the memory cell is generally connected to the row decoder as a word line, a voltage of, for example, 0 to 5 V is applied to the control gate of non-selected memory cells so that the FN injection can be prevented from being caused and that the erasing in a unit of word line (namely sector unit) can be performed.

In order to realize the erasing in a sector unit, however, the resistance to writing and erasing disturbance must be strong enough as compared to the flash type erasing as described on page 5 of the document 3. For example, a write disturb time of about 10 milliseconds is enough for the flash type erase method, but a write disturb time of about ten thousand seconds is necessary for the sector unit erasing, in case of providing a guarantee for one million times of rewriting. In this case, the "disturbance" means that in writing, erasing or reading of the selected memory cell, the amount of charge held in the floating gate of the non-selected memory cell, or the threshold voltage of the non-selected memory cell as viewed from the control gate is changed by the voltage applied to the non-selected memory cell. If the disturbance occurs in the write mode, erase mode or read mode, it is called "write disturbance", "erase disturbance" or "read disturbance" respectively. Since the disturbance causes the change of the threshold voltage of non-selected memory cell (usually, a high threshold voltage is changed to decrease by the disturbance but a low threshold voltage is changed to increase by the disturbance), the stored information will be lost if no countermeasure is taken to the disturbance.

In the document 3, the rate in dose of ion to be implanted in the drain is decreased in order to increase the resistance to the disturbance. When the dose rate in the drain is decreased, however, the drain voltage for writing is necessary to be higher, thus making it difficult to realize the rewriting under a low power supply voltage, for example, a single power source of 5 V.

SUMMARY OF THE INVENTION

It is an object of the invention to provide a nonvolatile semiconductor memory device which can be substantially improved in its resistance to disturbance by means of electrical circuit without optimizing the structure of memory cells or devising the manufacturing method as in the prior art.

According to the first aspect of the invention, in order to solve the prior art problem, an electrically writable nonvolatile semiconductor memory device is arranged to comprise a plurality of electrically writable non-volatile memory cells arranged in rows and columns, a decoder circuit for making at least one of the memory cells in a selected state and the other ones in a non-selected state, writing means for writing the memory cell in the selected state through the decoder circuit, reading means for reading the memory cell in the selected state through the decoder circuit, detecting means for detecting a change of a threshold voltage of each of the memory cells in the non-selected state, which change is caused by a voltage applied to the non-selected memory cell when writing the selected memory cell, and restoring means for restoring the threshold voltage of the non-selected memory cell to a value equal to or near to its original value before the change of the threshold voltage of the non-selected memory cell on the basis of a result of detecting the change of the threshold voltage of the non-selected memory cell.

In a preferred embodiment of the invention, the detecting means is arranged to provide a number of detection levels for detecting the threshold voltage of the selected memory cell more than a minimum number of the detection levels necessary for reading stored information of the selected memory cell and compare the detection levels with the detected threshold voltage of each memory cell thereby to obtain information on the change of the threshold voltage in addition to the information stored in the memory cell.

In another preferred embodiment of the invention, the nonvolatile semiconductor memory device further comprises a control circuit for causing the detecting means to operate, when a writing mode is specified by an external signal or command, after writing into the selected memory cell and causing the restoring means to operate based on a result of detection of the change of the threshold voltage of the non-selected memory cell.

According to the second aspect of the invention, an electrically writable and erasable nonvolatile semiconductor memory device is arranged to comprise a plurality of electrically writable and erasable nonvolatile semiconductor memory cells arranged in rows and columns, a decoder circuit for making at least one of the memory cells in a selected state and the other ones in a non-selected state, writing means for writing the memory cell in the selected state through the decoder circuit, erasing means for erasing the memory cell in the selected state through the decoder circuit, reading means for reading the memory cell in the selected state through the decoder circuit, detecting means for detecting a change of a threshold voltage of each of the non-selected memory cells, which change is caused by a voltage applied to the nonselected memory cell when erasing the selected memory cell, and restoring means for restoring the threshold voltage of the non-selected memory cell to a value equal to or near to its original value before the change on the basis of a result of detecting the change of the threshold voltage of the non-selected memory cell, wherein the detecting means is arranged to provide a number of detection levels for detecting the threshold voltage of the selected memory cell than a minimum number of the detection levels necessary for reading stored information of the selected memory cell and compare the detection levels with the threshold voltage of each memory cell thereby to obtain information on the change of the threshold voltage in addition to information stored in the memory cell.

In a preferred embodiment of the invention, the nonvolatile semiconductor memory device has also a control circuit for causing the detecting means to operate when an erasing mode is specified by an external signal or command, after erasing the selected memory cell and causing the restoring means to operate based on a result of detecting the change of the threshold voltage of the non-selected memory cell.

According to the third aspect of the invention, an electrically writable and erasable nonvolatile semiconductor memory device comprises a plurality of electrically writable nonvolatile semiconductor memory cells arranged in rows and columns, a decoder circuit for making at least one of the memory cells in a selected state and the other ones in a non-selected state, writing means for writing the memory cell in the selected state through the decoder circuit, erasing means for erasing the memory cell in the selected state through the decoder circuit, reading means for reading the memory cell in the selected state through the decoder circuit, first detecting means for detecting a change of a threshold voltage of each of the nonselected memory cells, which change is caused by a voltage applied to the non-selected memory cell when writing into the selected memory cell, second detecting means for detecting a change of the threshold voltage of each of the non-selected memory cells, which change is caused by a voltage applied to the non-selected memory cell when erasing the selected memory cell, and restoring means for restoring the threshold voltage of the non-selected memory cell to a value equal to or near to its original value before the change of the threshold voltage on the basis of a result of detecting the change of the threshold voltage of the non-selected memory cell by the first or second detecting means, wherein each of the first and second detecting means is arranged to provide a number of detection levels for detecting the threshold voltage of the selected memory cell than a minimum number of the detection levels necessary for reading information stored in the selected memory cell and to compare the detection levels with the threshold voltage of each memory cell thereby to obtain information on the change of the threshold voltages of the nonselected memory cell and information stored in the selected memory cell.

In a preferred embodiment of the invention, each of the first and second detecting means is arranged to provide a plurality of detection levels, of which a number is at least twice the minimum number of the detection levels necessary for reading information stored in the memory cell when obtaining information as to whether the threshold voltage of the non-selected memory cell has changed or not from its original value at the time of writing or erasing and to provide a plurality of threshold voltage detection levels, of which the number is at least three times a minimum number of the detection levels necessary for reading information stored in the memory cell when obtaining information as to whether the threshold voltage of the non-selected memory cell has increased or decreased from its original value at the time of writing or erasing, and to compare the detection levels with the threshold voltage of the non-selected memory cell to obtain information of the change of the threshold voltage of the non-selected memory cell and information of the original value before the change of the threshold voltages of the non-selected memory cell.

According to a fourth aspect of the invention, an electrically writable nonvolatile semiconductor memory device comprises a plurality of electrically writable nonvolatile semiconductor memory cells arranged in rows and columns, a decoder circuit for making at least one of the memory cells in a selected state and the other ones in a non-selected state, writing means for writing the memory cell in the selected state through the decoder circuit, reading means for reading the memory cell in the selected state through the decoder circuit, detecting means for detecting a change of a threshold voltage of each of the non-selected memory cells, which change is caused by a voltage applied to the non-selected memory cell when writing into the selected memory cell, restoring means for restoring the threshold voltage of the non-selected memory cell to a value equal to or near to its original value before the change thereof on the basis of a result of detecting the change of the threshold voltage of the non-selected memory cell, and counting means provided for each block including one or a plurality of the memory cells for counting a number of times of selection by which the block is selected for writing, wherein only when the number of times of selection exceeds a predetermined value, the change of the threshold voltage of the memory cell in the block is detected and the threshold voltage is restored.

According to a fifth aspect of the invention, an electrically writable and erasable nonvolatile semiconductor memory device comprises a plurality of electrically writable and erasable nonvolatile semiconductor memory cells arranged in rows and columns, a decoder circuit for making at least one of the memory cells in a selected state and the other ones in a non-selected state, writing means for writing the memory cell in the selected state through the decoder circuit, erasing means for erasing the memory cell in the selected state through the decoder circuit, reading means for reading the memory cell in the selected state through the decoder circuit, detecting means for detecting a change of a threshold voltage of each of the non-selected memory cells, which change is caused by a voltage applied to the non-selected memory cell when erasing the selected memory cell, restoring means for restoring the threshold voltage of the non-selected memory cell to a value equal to or near to its original value before the change thereof on the basis of a result of detecting the threshold voltage of the non-selected memory cell, and counting means provided for each block including one or a plurality of the memory cells for counting a number of times of selection by which the block is selected for writing or erasing, wherein only when the number of times of selection exceeds a predetermined value, the change of the threshold voltage of the memory cell in the block is detected and the threshold voltage is restored.

In an embodiment of the invention, a control circuit may be provided for reading count information from the counting means when a mode for detecting the change of the threshold voltage of the non-selected memory cell and restoring the threshold voltage is selected by an external signal or external command, and for activating the detecting means when the number of times of selection exceeds the predetermined value, and activating the restoring means when the change of the threshold voltage of the non-selected memory cell is detected.

In another embodiment of the invention, the detecting means is arranged to provide a number of detection levels more than a minimum number of the detection levels necessary for reading information stored in the memory cell and compare the detection levels with the threshold voltage of each memory cell to obtain information stored in the memory cell and information on the change of the threshold voltage.

In still another embodiment of the invention, the detecting means is arranged to provide a plurality of threshold voltage detection levels of which a number is at least twice a minimum number thereof necessary for reading information stored in the memory cell when obtaining information as to whether the threshold voltage of the non-selected memory cell has changed or not by comparing its original value with the detection levels at the time of writing or erasing or a plurality of threshold voltage detection levels of which a number is at least three times a minimum number thereof necessary for reading information stored in the memory cell when obtaining information as to whether the threshold voltage of the non-selected memory cell has changed up or down by comparing its original value with the detection levels at the time of writing or erasing, and to compare the detection levels with the threshold voltage of the non-selected memory cell to obtain information stored in the selected memory cell and information on the change of the threshold voltage of the non-selected memory cell.

According to a sixth aspect of the invention, an electrically writable and erasable nonvolatile semiconductor memory device comprises a plurality of electrically writable nonvolatile semiconductor memory cells arranged in rows and columns, a decoder circuit for making at least one of the memory cells in a selected state and the other ones in a non-selected state, writing means for writing the memory cell in the selected state through the decoder circuit, erasing means for erasing the memory cell in the selected state through the decoder circuit, reading means for reading the memory cell in the selected state through the decoder circuit, first detecting means for detecting a change of the threshold voltage of the non-selected memory cell, which change is caused by a voltage applied to the non-selected memory cell when writing the selected memory cell, second detecting means for detecting the change of the threshold voltage of the nonselected memory cell when erasing the selected memory cell, restoring means for restoring the threshold voltage of the non-selected memory cell to a value equal to or near to its original value before its change thereof on the basis of a result of detecting the change of the threshold voltage of the non-selected memory cell, and counting means provided for each block including one or a plurality of the memory cells for counting a number of times of selection by which the block is selected for writing or erasing, wherein only when the number of times of selection exceeds a predetermined value, the change of the threshold voltage of the memory cell in the block is detected and the threshold voltage thereof is restored.

In an embodiment of the invention, a control circuit may be provided for reading count information from the counting means when a mode for detecting the change of the threshold voltage of the non-selected memory cell and restoring the threshold voltage thereof is selected by an external signal or an external command, and activating the first or second detecting means if the number of times of selection exceeds a predetermined value, and activating, if the change of the threshold voltage of the non-selected memory cell is detected, the restoring means.

In another embodiment of the invention, each of the first and second detecting means is arranged to provide a number of detection levels more than a minimum number thereof necessary for reading information stored in the memory cell and compare the detection levels with the threshold voltage of each memory cell to obtain information stored in the selected memory cell or information on the change of its threshold voltage.

In still another embodiment of the invention, each of the first and second detecting means is arranged to provide a plurality of detection levels of which a number is at least twice a minimum number thereof necessary for reading information stored in the memory cell when obtaining information as to whether the threshold voltage of the non-selected memory cell has changed or not at the time of writing or erasing or a plurality of detection levels of which a number is at least three times a minimum number thereof necessary for reading information stored in the memory cell when obtaining information as to whether the threshold voltage of the non-selected memory cell has changed up or down at the time of writing or erasing, and to compare the detection levels with the threshold voltage of each memory cell to obtain information stored in the memory cell and information on the change of the threshold voltage of the memory cells.

Thus, as described above, after the memory cell as selected for writing or erasing is written or erased, a change of the threshold voltage of the non-selected memory cell is detected, and when the amount of the change is larger than a predetermined value, the non-selected memory cell is written or erased so that its threshold voltage can be restored to its original value. By the detecting means and restoring means, it is possible to prevent the stored information from being destroyed by disturbance.

DESCRIPTION OF THE PREFERRED EMBODIMENTS

Figure 1:
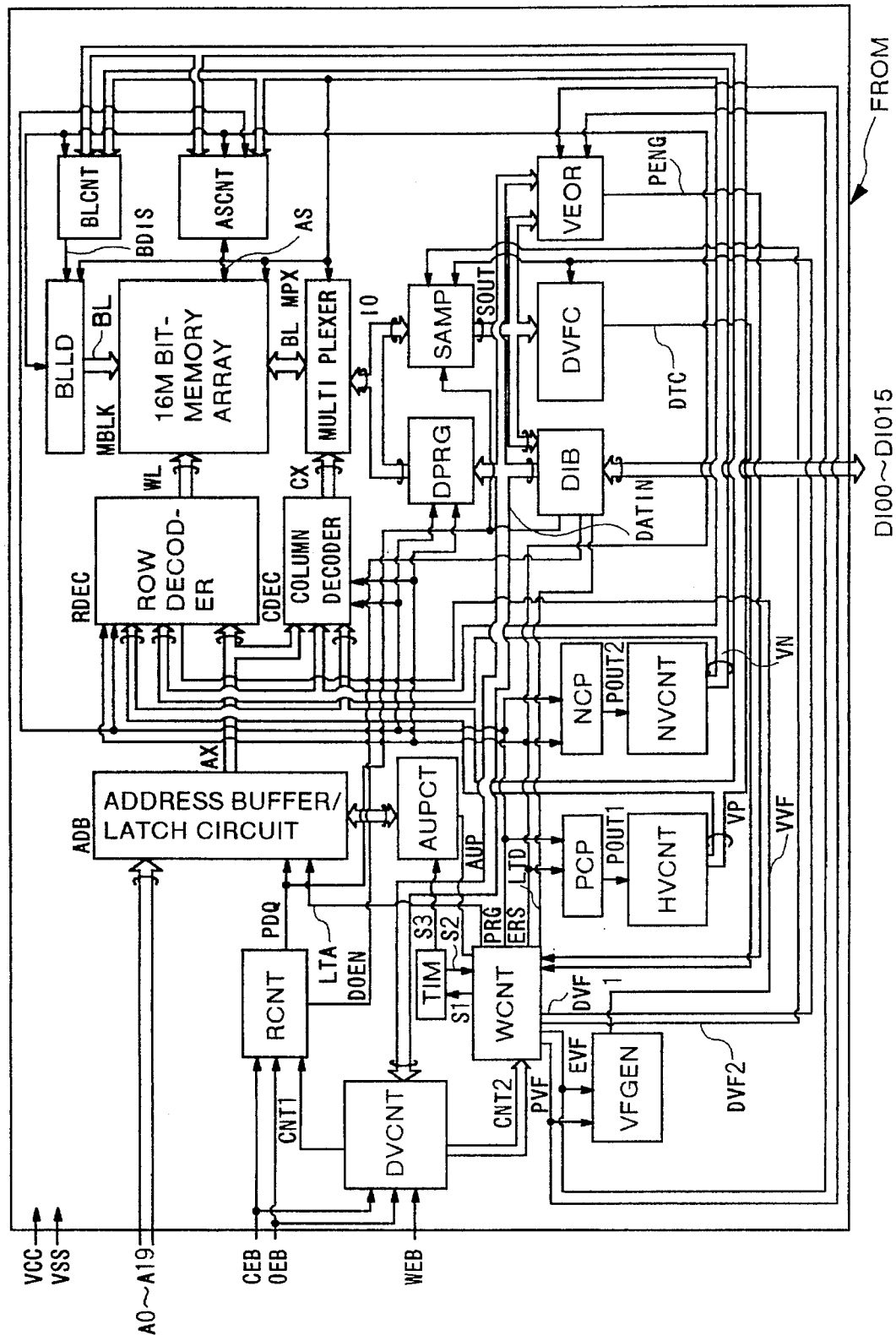
FIG. 1 is a circuit block diagram of the first embodiment of the invention.

FIG. 1 is a circuit block diagram of the first embodiment of the invention. Referring to FIG. 1, there is generally shown an FROM which is an electrically rewritable nonvolatile semiconductor memory device having a memory capacity of for example (1048576 words×16 bits=16777216 bits). Address input signals A0, A1, ..., A19, a chip enable signal CEB, an output enable signal OEB, a write enable signal WEB, a power supply voltage VCC and a ground potential VSS are input signals to the FROM from the outside. Input/output data DIO0 through DIO15 are input data from the outside when writing, or writing and erasing and output data to the external when reading. The embodiment of FIG. 1 includes not only the circuits for writing and erasing but also the verify circuits for verifying for writing and erasing and for disturbance.

In FIG. 1, DVCNT represents a device control command discrimination circuit which receives the write enable signal WEB, chip enable signal CEB, output enable signal OEB for operation modes of FROM and a plurality of internal input data DATIN, and which produces a control signal CNT1 and a plurality of control signals CNT2. For example, the control signals CNT2 include control signals for indicating the writing mode or erasing mode.

RCNT represents a chip/output selection state control circuit which receives the chip enable signal CEB, output enable signal OEB and control signal CNT1 for control and which produces a power-down signal PDQ and an output buffer activation signal DOEN.

A write state control circuit WCNT receives the control signals CNT2, a timer end signal S2, a disturb verify data output signal DTC and a write/erase verify data output signal PENG for control and produces a write signal PRG, an erase signal ERS, a write verify signal PVF, an erase verify signal EVF, disturb data verify signals DVF1 and DVF2, an address counter-up signal AUP, a timer start signal S1, an address latch signal LTA and a data latch signal LTD.

A timer circuit TIM receives the timer start signal S1 from the write state control circuit WCNT and a certain time later, it supplies an address-up clock signal S3 to an address-up counter AUP and the timer end signal S2 to the write state control circuit WCNT.

An address buffer/latch circuit ADB receives the address input data A0, A1, ..., A19, the power-down signal PDQ for control and the address latch signal LTA and produces a plurality of internal address signals AX.

A row decoder RDEC receives the internal address signals AX to be decoded, the write signal PRG, the erase signal ERS, a plurality of high voltage signals VP, a plurality of negative voltage signals VN and a write/erase verify voltage signal VVF and produces a plurality of (for example, 4096) word line signals WL.

A column decoder CDEC receives the internal address signals AX, the write signal PRG, the erase signal ERS, the plurality of high voltage signals VP and the plurality of negative voltage signals VN and produces a plurality of (for example, 256) multiplexer selection signals CX.

A memory block MBLK is formed of for example 16777216 memory cells which are connected to word lines, bit lines and memory cell source lines.

A multiplexer MPX receives the multiplexer selection signal CX and is connected to a plurality of (for example, 4096) bit lines BL for input and output and to a plurality of (for example, 16) internal data lines IO for input and output. Some signals of the negative voltage signals VN are applied to the substrate terminals of the transistors in the memory cell array MBLK and multiplexer MPX.

A write/erase verify voltage generation circuit VFGEN receives a write verify signal PVF and an erase verify signal EVF and produces the write/erase verify voltage signal VVF.

A positive high voltage charge pump circuit PCP receives the write signal PRG and erase signal ERS and produces a positive charge pump voltage signal POUT1.

A negative voltage charge pump circuit NCP receives the write signal PRG and erase signal ERS and produces a negative charge pump voltage signal POUT2.

A positive high voltage control circuit HVCNT receives the positive charge pump voltage signal POUT1 and produces a plurality of positive high voltage signals VP.

A negative high voltage control circuit NVCNT receives the negative charge pump voltage signal POUT2 and produces a plurality of negative high voltage signals VN.

A memory cell array source line control circuit ASCNT receives the write signal PRG, erase signal ERS, the plurality of positive high voltage signals VP and the plurality of negative voltage signals VN and produces or receives a memory cell source line signal AS.

A bit line voltage control circuit BLCNT receives the plurality of positive high voltage signals VP, the plurality of negative high voltage signals VN and the erase signal ERS and produces a bit line load voltage signal BDIS.

A bit line load circuit BLLD receives the bit line load voltage signal BDIS and the erase signal ERS and produces signals on a plurality of bit lines BL.

A sense amplifier circuit SAMP receives data on internal IO lines, the power-down signal PDQ and output signal DVF1 and DVF2 for control and produces a sense amplifier output signal SOUT.

A disturb verify data detector circuit DVFC receives the output signal SOUT for data from the sense amplifier circuit and the voltage signal DVF1 for control and produces a disturb verify data output signal DTC.

A write/erase verify data coincidence detector circuit VEOR receives the output SOUT and internal data input DATIN for data and the write verify signal PVF and erase verify signal EVF for control and produces a write/erase verify data output signal PENG.

A data input/output buffer DIB receives the output buffer activation signal DOEN and power-down signal PDQ for control, the data latch signal LTD for latch and the output signal SOUT for data, produces the internal data input DATIN for data and receives/produces data input/output signals DIO0 through DIO15.

A data program circuit DPRG receives the internal data input DATIN for data and the write signal PRG and erase signal ERS for control and produces output data on the internal data lines IO.

FIGS. 2 through 5 show parts of the circuit diagram of this embodiment. In other words, FIGS. 2, 3, 4 and 5 respectively show the upper left portion, the lower left portion, the upper right portion and the lower right portion, of the circuit block diagram of FIG. 1.

In FIGS. 2 through 5, the number of memory cells, the number of address lines and the number of data input/output lines are decreased without losing the purpose of this invention as compared to those in FIG. 1 for the sake of better understanding. FIGS. 2 through 5 do not show the device control command discrimination circuit DVCNT, chip/output selection state control circuit RCNT, wright state control circuit WCNT, write/erase verify voltage generation circuit VFGEN, disturb verify data detector circuit DVFC, write/erase verify data coincidence detector circuit VEOR, timer TIM and address-up counter AUPCT which are shown in FIG. 1. In addition, although a single kind of erase signal is shown in FIG. 1, two different erase signals and erase systems are provided in FIGS. 2 through 5. Moreover, the data input buffer of the data input/output buffer DIB shown in FIG. 1 is omitted and the data output buffer corresponds to the output buffer DBF shown in FIG. 5. Also, the input DIN to the data program circuit DPRG shown in FIG. 5 corresponds to one of the DATIN shown in FIG. 1.

In FIGS. 2 through 5, an electrically alterable nonvolatile semiconductor memory device, BEROM, receives address from the external through address input terminals A0, A1, A2 and A3, receives internal input data through the data input terminal DIN of the data program circuit and produces output data through an output terminal DO. This memory device BEROM includes address buffers ADB1, ADB2, ADB3 and ADB4, the row decoder circuit RDEC formed of DEC1, DEC2, DEC3 and DEC4, the column decoder circuit CDEC formed of DEC5, DEC6, DEC7 and DEC8, the memory block MBLK formed of memory cells MC1, MC2, ..., MC16, the multiplexer MPX, the data program circuit DPRG, the sense amplifier SAMP, the output buffer circuit DBF, the positive high voltage charge pump circuit PCP, the negative voltage charge pump circuit NCP, the positive high voltage control circuit HVCNT, the negative voltage control circuit NVCNT, the memory cell source line voltage control circuit ASCNT, the bit line voltage control circuit BLCNT, the bit line load circuit BLLD, oscillators OSC1, OSC2 and OSC3 and other logic circuits. A positive power supply voltage (for example, 5 V) from the external and ground potential to the memory device are applied through a terminal VDD and the terminal VSS respectively.

In the memory device, the address terminal A0 is connected to the input of the address buffer ADB1, the address terminal A1 to the input of the address buffer ADB2, the address terminal A2 to the input of the address buffer ADB3 and the address terminal A3 to the input of the address buffer ADB4. The outputs, AX0 and AX0B of the address buffer ADB1 are connected to the inputs of the AND NOT gates (hereinafter, referred to as "NAND gate") of row decoders RDEC, the outputs, AX1 and AX1B of the address buffer ADB2 to the inputs of the NAND gates of the row decoder RDEC, the outputs, AY0 and AY0B of the address buffer ADB3 to the inputs of the NAND gates of the column decoder CDEC, and the outputs, AY1 and AY1B of the address buffer ADB4 to the inputs of the NAND gates of the column decoder CDEC.

The row decoder RDEC is formed of four equivalent circuits, DEC1, DEC2, DEC3 and DEC4.

The circuit DEC1 is comprised of a two-input NAND gate ND1 to which the outputs AX0B and AX1B from the address buffers ADB1 and ADB2 are applied, two two-input OR NOT gates (hereinafter, referred to as "NOR gate") NR1 and NR2, an inverter IV1, a positive high voltage switch circuit HVSW1 and a negative voltage switch circuit NVSW1. The output, N1 from the NAND gate ND1 is supplied to one input ends of the NOR gates NR1 and NR2. An output ERSB1 is supplied to the other input of the NOR gate NR1 and an output CLK1 to the other end of the NOR gate NR2. The output N2 from the NOR gate NR1 is supplied to the input end of the inverter IV1, the output N3 from the inverter IV1 to one input end of the positive high voltage switch circuit HVSW1 and the output N4 from the NOR gate NR2 to one input end of the negative voltage switch circuit NVSW1.

The positive high voltage switch circuit HVSW1 receives the output N3, and high voltage signals VPP1, WEL1 and ISO1 and has its output connected to a row (word) line WL0 of the memory block MBLK.

The negative voltage switch circuit NVSW1 receives the output N4, a signal WEL2 and a negative voltage signal VPN1 and has its output connected to the same row line WL0 as the output of the positive high voltage switch circuit HVSW1.

The circuits DEC2, DEC3 and DEC4 are the same as the circuit DEC1, but are different in the combinations of input signals from the address buffers ADB1 and ADB2 to their NAND gate and in the row lines on which their outputs are produced. The output from the circuit DEC2 is connected to a row line WL1, the output from the circuit DEC3 to a row line WL2 and the output from the circuit DEC4 to a row line WL3.

The column decoder CDEC is comprised of four equivalent circuits, DEC5, DEC6, DEC7 and DEC8.

The circuit DEC5 includes a two-input NAND gate ND2 to which the outputs AY0B and AY1B from the address buffers ADB3 and ADB4 are applied, two two-input NOR gates NR6 and NR17, an inverter IV6, a positive high voltage switch circuit HVSW2 and a negative voltage switch circuit NVSW3. The output N5 from the gate ND2 is supplied to one input ends of the NOR gates NR6 and NR17. A signal N18 is supplied to the other input end of the NOR gate NR6 and a signal CLK to the other input end of the NOR gate NR17. The output N15 of the NOR gate 6 is connected to the input end of the inverter IV6, the output N16 of the inverter IV6 to one input end of the positive high voltage switch circuit HVSW2 and the output N17 of the NOR gate NR17 to one input end of the negative voltage switch circuit NVSW3.

The positive high voltage switch circuit HVSW2 receives the output N16, the high voltage signal VPP1 and signals WEL5, IS03 and has its output connected to a column line selection signal C1 of the multiplexer MPX.

The negative voltage switch circuit NVSW3 receives the output N17, a signal WEL6 and the negative voltage signal VPN1 and has its output connected to the same column line selection signal C1 as the output of the positive high voltage switch circuit HVSW2.

The circuits DEC6, DEC7 and DEC8 are the same as the circuit DEC5, but are different in the combinations of input signals from the address buffers ADB3, ADB4 to the NAND gate and in their column line selection signal. The output of the circuit DEC6 is connected to a column line selection signal C2, the output of the circuit DEC7 to a column line selection signal C3 and the output of the circuit DEC8 to a column line selection signal C4.

The memory block MBLK is comprised of sixteen memory cells of MC1, MC2, . . . , MC16 each of which has a drain terminal, a source terminal, a control terminal, a floating gate terminal and a substrate terminal common to each memory cell. Each memory cell has for example drain and source regions on the semiconductor substrate surface and a thin oxide film on the top of the semiconductor substrate surface between the drain region and the source region. In addition, the floating gate of for example polycrystalline silicon is formed on the thin oxide film and the control gate of for example polycrystalline silicon is formed on an interlayer insulating film over the floating gate. The drain region is electrically connected to the drain terminal, the source region to the source terminal, the control gate to the control gate terminal and the substrate to the substrate terminal. The control gate terminals of the memory cells MC1, MC2, MC3 and MC4 are connected to the row line WL0, the control gate terminals of the memory cells MC5, MC6, MC7 and MC8 to the row line WL1, the control gate terminals of the memory cells MC9, MC10, MC11 and MC12 to the row line WL2, and the control gate terminals of the memory cells MC13, MC14, MC15 and MC16 to the row line WL3. The drain terminal of the memory cells MC1, MC5, MC9 and MC13 are connected to the column line BL0, the drain terminals of the memory cells MC2, MC6, MC10 and MC14 to the column line BL1, the drain terminals of the memory cells MC3, MC7, MC11 and MC15 to the column line BL2 and the drain terminals of the memory cells MC4, MC8, MC12 and MC16 to the column line BL3. In other words, the memory cells are arranged in a matrix of four rows×four columns. The source terminals of the memory cells MC1, MC2, . . . , MC16 are connected to the common memory source line AS and the substrate terminals of the memory cells MC1, MC2, . . . , MC16 are connected to a substrate voltage signal VSUB.

The multiplexer MPX is comprised of MOS transistors M1, M2, M3 and M4 of for example N-channel enhancement type. The transistor M1 has its drain connected to the column line BL0 and its gate connected to the column line selection signal C1. The transistor M2 has its drain connected to the column line BL1 and its gate connected to the column line selection signal C2. The transistor M3 has its drain connected to the column line BL2 and its gate connected to the column line selection signal C3. The transistor M4 has its drain connected to the column line BL3 and its gate connected to the column line selection signal C4. The substrate of the transistors M1, M2, M3 and M4 is connected to the substrate voltage signal VSUB and the source electrodes of the transistors M1, M2, M3 and M4 are connected to an internal data line DIO.

The data program circuit DPRG is comprised of a two-input NOR gate NR4, inverters IV2, IV3 and IV4, N-channel enhancement type MOS transistors M15, M16, M10 and M11 and P-channel enhancement type MOS transistors M17, M18 and M9. The NOR gate NR4 has one input end connected to the data input terminal DIN and its other end connected to a line WRB. The output N6 of the NOR gate NR4 is connected to the input of the inverter IV2 and the output N7 of the inverter IV2 is connected to the input of the inverter IV3 and the gate terminal of the transistor M15. The output N8 of the inverter IV3 is connected to the gate terminal of the transistor M16 and the drain terminal of the transistor M16 to a node N10. The node N10 is connected to the gate terminal of the transistor M17, the drain terminal of the transistor M18, the gate terminal of the transistor M9 and the gate terminal of the transistor M10. The drain terminal of the transistor M15 is connected to a node N9, which is connected to the drain terminal of the transistor M17 and the gate terminal of the transistor M18. The source terminals of the transistors M17, M18 and M9 are connected to the high voltage signal VPP3 and the substrate terminals of the transistors M17, M18 and M9 are also connected to the high voltage signal VPP3. The source terminals of the transistors M15, M16 and M11 are connected to the ground terminal VSS and the substrate terminals of the transistors M15, M16, M10 and M11 are also connected to the ground terminal VSS. The input of the inverter IV4 is connected to the line WRB, the output WR of the inverter IV4 to the gate terminal of the transistor M11 and the drain terminal of the transistor M11 to a node 19 which is connected to the source terminal of the transistor M10. The drain terminals of the transistors M10 and M9 are connected to the internal data line DIO.

The memory source line voltage control circuit ASCNT includes inverter circuits IV5 and IV6, a two-input NOR gate NR5, a two-input NAND gate ND3, an N-channel enhancement MOS transistor M13, a P-channel enhancement MOS transistor M12 and a positive high voltage switch HVSW4. The inverter IV6 has its input connected to an output PRGB and its output N11 connected to one input end of the NOR gate NR5. The other input end of the NOR gate NR5 is connected to an output ERSB2. The NAND gate ND3 has one input end connected to the output PRGB and the other input end connected to the output ERSB2. The output N12 of the NOR gate NR5 is connected to one input end of the positive high voltage switch HVSW4, the output N14 of the NAND ND3 to the input of the inverter IV5 and the output N15 of the inverter IV5 to the gate terminal of the transistor M13. The positive high voltage switch HVSW4 receives a high voltage signal VPP2 and the output N12 and produces an output N13. The output N13 is connected to the gate terminal of the transistor M12. The source terminal of the transistor M12 is connected to the high voltage signal VPP2, and the drain terminals of the transistors M12 and M13 to the memory source line AS. The substrate terminal of the transistor M12 is connected to the high voltage signal VPP2 and the source terminal and substrate terminal of the transistor M13 are connected to a negative voltage signal VPN2.

The bit line load circuit BLLD is comprised of N-channel enhancement type MOS transistors M5, M6, M7 and M8. The transistors M5, M6, M7 and M8 have their drain terminals connected to the column lines (bit lines) BL0, BL1, BL2 and BL3 respectively, their gate terminals connected to the bit erase signal ER2, their source terminals connected to the bit line load voltage signal BDIS and their substrate terminals connected to the substrate voltage signal VSUB.

The bit line voltage control circuit BLCNT is comprised of a positive high voltage switch HVSW3 and a negative voltage switch NVSW2. The positive high voltage switch HVSW3 receives an output ER2B of the inverter IV8, signals WEL3 and IS02 and the high voltage signal VPP3 and produces the output BDIS. The negative voltage switch NVSW2 receives an output CLK2 of the oscillator OSC2, an output WEL4 and a negative voltage signal VPN3 and produces the output BDIS.

The write signal PRG is supplied to one input end of the positive high voltage charge pump circuit PCP, one input end of the negative voltage charge pump circuit NCP, one input end of the negative voltage control circuit NVCNT, one input end of the positive high voltage control circuit HVCNT, the input of the oscillator OSC1, one input end of a three-input NOR gate NR3, one input end of a two-input NOR gate NR9 and the input of an inverter IV7.

The block erase signal ER1 is supplied to one input end of the address buffer ADB3, one input end of the address buffer ADB4, one input end of the positive high voltage charge pump circuit PCP, one input end of the positive high voltage control circuit HVCNT, one input terminal of the negative voltage control circuit NVCNT, one input end of the negative voltage charge pump circuit NCP, one input end of the three-input NOR gate NR3, one input end of the two-input NOR gate NR8, one input end of a two-input NOR gate NR7 and the input ends of the oscillators OSC2 and OSC3.

The bit erase signal ER2 is supplied to one input end of the positive high voltage charge pump circuit PCP, one input end of the positive high voltage control circuit HVCNT, one input end of the negative voltage control circuit NVCNT, the gate terminals of the transistors M5, M6, M7 and M8 of the bit line load circuit BLLD, one input end of the three-input NOR gate NR3, one input end of the two-input NOR gate NR9, one input end of the two-input NOR gate NR8, one input end of the two-input NOR gate NR7 and the input of the inverter IV8.

The output WRB of the NOR gate NR3 is supplied to one input end of the NOR gate NR4, the input of the inverter IV4, one input end of the sense amplifier circuit SAMP and one input end of the output buffer DBF. The output ERSB1 of the NOR gate NR8 is supplied to one input end of the NOR gate NR1 and the output N18 of the NOR gate NR9 to one input end of the NOR gate NR6. The output ERSB2 of the NOR gate NR7 is supplied to one input ends of the NOR gate NR5 and NAND gate ND3. The outputs CLK1, CLK2 and CLK3 of the oscillators OSC1, OSC2 and OSC3 are supplied to one input ends of the NOR gate NR2, negative voltage switch NVSW2 and NOR gate NR17 respectively.

The positive high voltage charge pump circuit PCP receives the outputs PRG, ER1 and ER2 and produces the output POUT1. The negative voltage charge pump circuit NCP receives the outputs PRG and ER1 and produces the output POUT2. The positive high voltage control circuit HVCNT receives the outputs POUT1, PRG, ER1 and ER2 and produces outputs VPP1, VPP2, VPP3, WEL1, WEL2, WEL3, WEL4, WEL5, WEL6, ISO1, ISO2 and IS03. The negative voltage control circuit NVCNT receives the outputs POUT2, PRG, ER1 and ER2 and produces outputs VPN1, VPN2, VPN3 and VSUB.

The sense amplifier circuit SAMP receives data on the internal data line DIO and the output WRB for control and produces the output signal SOUT. The output buffer DBF receives the output signal SOUT and the output WRB for control and produces output data at the output terminal DO.

The writing, erasing and reading operations of the memory device BEROM of this embodiment will be described with reference to FIGS. 2 through 5. The memory device BEROM of this embodiment is a nonvolatile semiconductor memory device which performs writing, first erasing, second erasing and reading of data of one binary bit in or from each of the memory cells of 16 bits (four rows×four columns). The row line selection address is determined by A0 and A1 and the column line selection address by A2 and A3.

The following table 1 lists various voltage values to be applied to the memory cells in this embodiment. The operation in each mode will be described with reference to Table 1 and FIGS. 2 through 5. The writing operation is started by changing the write signal PRG from low ("L") level to high ("H") level (ER1=ER2="L"). The negative voltage charge pump circuit NCP is started operating by the "H" level of the signal PRG. This circuit NCP generates a negative voltage of for example −8 V from the power supply voltage (for example, 5 V) and ground potential (for example, 0 V). An example of this circuit is shown in for example FIG. 4 of the document 2.

TABLE 1

| Modes | Selected word line | Non-selected word line | Selected bit line | Non-selected bit line | Memory source line | Memory cell substrate voltage |
|---|---|---|---|---|---|---|
| Write | −8 V | 0 V | 5 V<br>0 V | 0 V | Open | 0 V |
| Erase (block) | 10 V | 0 V | −8 V | no | −8 V | −8 V |
| Erase (bit) | 12 V | 0 V | 0 V<br>5 V | 5 V | 5 V | 0 V |
| Read | 5 V | 0 V | 1 V | 0 V | 0 V | 0 V |

The negative voltage control circuit NVCNT controls negative voltage and generates 0 V or a negative voltage (for example, −8 V). When PRG="H" and ER1=ER2="L", the negative voltage control circuit NVCNT generates VPN1= −8 V and VPN2=VPN3=VSUB=0 V.

The positive high voltage charge pump circuit PCP generates a positive voltage of for example 12 V from the power supply voltage VDD and the ground potential. An example of this circuit is shown in for example FIG. 5 of the document 2. When PRG="H" and ER1=ER2="L", the positive high voltage charge pump circuit PCP operates and generates POUT of for example 12 V.

The positive high voltage control circuit HVCNT controls positive high voltage and generates voltages between 0 V and a positive high voltage (for example, 12 V). When PRG="H" and ER1=ER2="L", the control circuit HVCNT generates voltages of VPP1=WEL5=WEL6=12 V, VPP2= VPP3=WEL3=ISO1=5 V and IS02=IS03=WEL1=WEL2=0 V.

If the memory cell MC1 is selected, the address of A0=A1=A2=A3="L" is supplied so that the two-input NAND gate ND1 of the row decoder DEC1 produces "L". When PRG="H", the oscillator OSC1 starts oscillating and generates CLK1 (an amplitude of for example 5 V at 30 MHz). The output of the two-input NOR gate NR8 is "H", and the output N3 of the inverter IV1 is "H", turning the positive high voltage switch HVSW1 off. The output N4 of the two-input NOR gate NR2 oscillates due to the levels of the output N1 of ND1 and output CLK1 of OSC1. Thus the negative voltage switch NVSW1 is turned on so that a voltage of VPN1, or −8 V is applied on the row line (word line) WL0. The row lines WL1, WL2 and WL3 are for example 0 V because both positive voltage switch and negative voltage switch of column decoders DEC2, DEC3 and DEC4 are in the off-state. Similarly in the column decoder DEC5 the positive high voltage switch HVSW2 is turned on and the negative voltage switch NVSW3 is made off. Thus the column line selection signal C1 becomes a voltage of VPP1, or 12 V, and C2=C3=C4=0 V.

When write data of for example "L" is applied to the data input terminal DIN, writing operation is performed. When write data of "H" is applied thereto, writing operation is not made. In the erase mode, when PRG="H" and ER1=ER2= "L", WRB is "L". In the data input buffer DIB, since DIN="L", N7 and N8 are "H" and "L" respectively with the result that the same voltage as VPP3, or 5 V is produced on the internal data line DIO. When DIN="H", the internal data line DIO is for example at 0 V. In the multiplexer MPX, since only the transistor M1 is turned on, the column line BL0 is at for example 5 V when DIN="L" or at for example 0 V when DIN="H". The column lines BL1, BL2 and BL3 are at for example 0 V. Here, it is assumed that an inverting signal at the external data input terminal is applied to the internal data input terminal DIN.

At the time of writing, since the output PRGB of inverter IV7 is "L" and ERSB2="H", the positive high voltage switch HVSW4 of the memory cell source line voltage control circuit ASCNT is turned on and the output N13 is the same voltage as VPP2, or 5 V. In addition, the output N15 of inverter IV5 is "L" and both transistors M12 and M13 become in the off-state. As a result, the memory source line AS is electrically opened. The transistors M5, M6, M7 and M8 of the bit line load circuit BLLD are turned off since their gate voltages are "L".

Therefore, when writing, the control gate terminal, drain terminal and substrate terminal of the selected memory cell MC1 are at for example −8 V, 5 or 0 V and 0 V respectively and its source terminal is in the open state. When the drain terminal is at 5 V, the voltage difference between the drain terminal and control gate terminal induces a high electric field in the thin oxide film between the floating gate and drain gate of that memory cell. Thus electrons are discharged from the floating gate to the drain region by FN injection. Consequently, the threshold of the memory cell is reduced (for example, from 7 V to 2 V), thus the memory cell being in the written state. The nonselected memory cells MC2, . . . , MC16 are not in the written state since a potential difference enough to cause the FN injection is not applied thereto (in order to cause the FN injection, it is necessary to make a potential difference of for example 11 V or more between the drain and control gate).

In the first erase mode, the block erase signal ER1 ="H" and PRG=ER2="L" and thus the positive high voltage charge pump circuit PCP and negative voltage charge pump circuit NCP start operating so that for example POUT1=12 V and POUT2=−8 V. The positive high voltage control circuit generates for example VPP1=WEL1=WEL2=10 V, VPP2=VPP3=IS02=ISO3=5 V and ISO1=WEL3=WEL4= WEL5=WEL6=0 V. The negative voltage control circuit NVCNT generates for example VPN1=VPN2=VPN3= VSUB=−8 V.

When A0=A1=A2=A3="L" are inputted to the address like the writing mode, the positive high voltage switch HVSW1 of the row decoder DEC1 is turned on and the negative voltage switch NVSW1 thereof is turned off. The row line (word line) WL0 is at the same voltage as VPP1, or 10 V. The non-selected row lines WL1, WL2 and WL3 are at for example 0 V. The block erase signal ER1 becomes "H" and thus the address buffers ADB3 and ADB4 generate AY0=AY0B=AY1=AY1B="H" whatever value the address data A2 and A3 take. The positive high voltage switches HVSW2 of the column decoders DEC5, DEC6, DEC7 and DEC8 are turned off and the negative voltage switches NVSW3 thereof are turned on. The column line selection signals C1, C2, C3 and C4 are the same voltage as VPN1, or −8 V.

In the first erase mode, the positive high voltage switch HVSW3 of the bit line voltage control circuit BLCNT is turned off and the negative voltage switch NVSW2 thereof is turned on. The output BDIS is the same voltage as VPN3, or −8 V. The transistors M5, M6, M7 and M8 of the bit line load circuit BLLD are in the on-state since their substrate terminals are at VSUB=−8 V though their gate voltage is "L". Thus the column lines (bit lines) BL0, BL1, BL2 and BL3 are at the same voltage as the substrate voltage, or −8 V. In addition, the transistors M1, M2, M3 and M4 of the multiplexer MPX are turned off since a negative voltage is applied not only to their drain terminals but also to their gate terminals. The internal data line DIO is at for example 0 V or 5 V due to the input data DIN.

In the first erase mode, only a single memory cell cannot be erased but the memory cells MC1, MC2, MC3 and MC4 connected to the selected row line WL0 can be erased at a time. A voltage of for example 10 V is applied to the control gate terminals of the memory cells MC1 through MC4 and a voltage of for example −8 V to their drain, source and substrate terminals. The voltage difference between the substrate and control gate terminals causes the FN injection so that electrons are injected from the substrate into the floating gates. As a result, the thresholds of the memory cells MC1, MC2, MC3 and MC4 are increased (for example, from 2 V to 7 V), thus the memory cells being erased. The first erasing method is also called word line erasing, block erasing or sector erasing.

In the second erasing mode, the bit erase signal ER2="H" and PRG=ER1="L". The positive high voltage charge pump circuit PCP starts operating and the output POUT1 is for example 12 V. The negative voltage charge pump circuit NCP does not operate and the output POUT2 is for example 0 V. The positive high voltage control circuit HVCNT generates for example VPP1=WEL1=WEL2=12 V, VPP2=VPP3=WEL3=WEL4=WEL5=WEL6=5 V and ISO1=ISO2=IS03=0 V. The negative voltage control circuit NVCNT generates for example VPN1=VPN2=VPN3=VSUB=0 V. When the address A0=A1=A2=A3="L", the positive high voltage switch HVSW1 of the row decoder DEC1 is turned on and the negative voltage switch NVSW1 thereof is turned off. The row line WL0 is at the same voltage as VPP1, or 12 V. The row lines WL1, WL2 and WL3 are not selected and are at for example 0 V. In addition, the positive high voltage switch HVSW4 of the column decoder DEC5 is turned on and the negative voltage switch NVSW3 thereof is turned off. The column line selection signal C1 is the same voltage as VPP1, or 12 V. The non-selected column line selection signals C2, C3 and C4 are for example 0 V.

In the second erase mode, the positive high voltage switch HVSW4 of the memory source line voltage control circuit ASCNT is turned off since PRGB="H" and ERSB2="L". Thus the node N13 is at "L" and the output N15 of the inverter IV5 is also "L". Therefore, the transistor M13 is turned off and the transistor M12 is turned on. The memory source line AS is at the same voltage as VPP2 for example 5 V. When the data input terminal DIN is at "H", the internal data line DIO is at 0 V. When the data input terminal DIN is at "L", the data line DIO is at the same voltage as VPP3 for example 5 V. At this time, the positive high voltage switch HVSW3 of the bit line voltage control circuit BLCNT is turned on and the negative voltage switch NVSW2 thereof is turned off. The output BDIS is at the same voltage as VPP3 for example 5 V. In addition, the transistors M5, M6, M7 and M8 of the bit line load circuit BLLD are turned on since their gate voltage is "H". Since the transistor M1 of the multiplexer MPX is in the on-state, when the data input terminal DIN is at "H" current flows from VPP3 to the ground terminal through BDIS, BL0 and DIO. At this time, if the resistance value of the transistor M5 is much larger than that of transistor M1, the column line BL0 can be set at almost 0 V. Moreover, when the data input terminal DIN is at "L", Both BDIS and DIO are at the same voltage as VPP3 for example 5 V and thus the bit line BL0 is also at 5 V. The column lines BL1, BL2 and BL3 are set at substantially the same voltage as BDIS for example 5 V since they have no path through which current flows.

Therefore, the control gate terminal, source electrode, drain electrode and substrate electrode of the selected memory cell MC1 are at 12 V, 5 V, 0 V and 0 V respectively. Thus electrons are injected from the channel of the memory cell into the floating gate by HE injection. The result is that the threshold of the memory cell MC1 is increased (for example, from 2 V to 7 V). Although the control gate terminals of the nonselected memory cells MC2, MC3 and MC4 are also at 12 V, the drain and source electrodes are at a high voltage of 5 V and there is no potential difference between the drain and source electrodes so that neither FN injection nor HE injection is caused. Other non-selected memory cells MC5, MC9 and MC13 are in the off-state since their control gate electrodes, source electrodes and drain electrodes are at 0 V, 5 V and 0 V respectively, and neither FN injection nor HE injection is caused therein because the potential difference is small. Accordingly, only the selected memory cell can be erased and controlled to be erased or not to be erased by input data.

In the read mode, PRG=ER1=ER2="L" and the positive high voltage charge pump circuit PCP and negative voltage charge pump circuit NCP do not operate so that for example POUT1=POUT2=0 V. The positive high voltage control circuit HVCNT generates for example VPP1=VPP2=VPP3=WEL1=WEL2=WEL3=WEL4=WEL5=WEL6=5 V and ISO1=IS02=IS03=0 V. The negative voltage control circuit NVCNT generates for example VPN1=VPN2=VPN3=VSUB=0 V. At this time the output WRB of the three-input NOR gate NR3 becomes "H", the data program circuit DPRG is inactive and the sense amplifier circuit SAMP and output buffer DBF are activated. When the address input is for example A0=A1=A2=A3="L", the row line WL0 is at for example 5 V. When the memory cell MC1 is in the written state (for example, the threshold voltage is 2 V), the memory cell MC1 is in the on-state and current flows, for example, from SAMP through DIO and BL0 (in this case, the voltage on BL0 is supplied from SAMP). In addition, when the memory cell MC1 is in the erased state (for example, the threshold voltage is 7 V), the memory cell MC1 is in the off-state and the above current does not flow. The presence or absence of this current is detected and amplified by the sense amplifier circuit SAMP and fed through the output buffer DBF to the output terminal DO.

Figure 6:
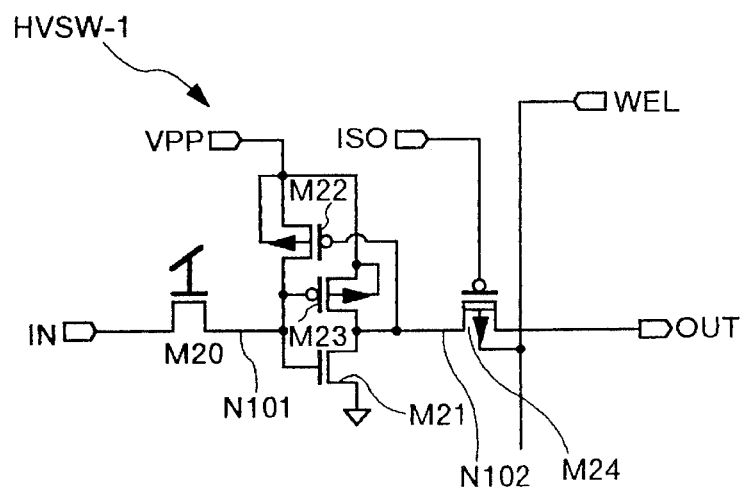
FIG. 6 is a circuit diagram of the positive high voltage switch in FIG. 2.

The positive high voltage switch HVSW-1 of FIG. 6 includes for example N-channel enhancement MOS transistors M20 and M21, P-channel enhancement MOS transistors M22 and M23, a P-channel depression MOS transistor M24, a switch input terminal IN, a positive high voltage input terminal VPP, a negative voltage blocking signal input terminal ISO, a substrate input terminal WEL, an output terminal OUT, a power supply terminal and a ground terminal. The threshold of the N-channel enhancement MOS transistor is for example 0.8 V, the threshold of the P-channel enhancement MOS transistor is for example −0.8 V and that of the P-channel depression MOS transistor is for example 2 V.

In the positive high voltage switch HVSW1, the drain, gate and source terminals of the MOS transistor M20 are connected to the switch input terminal IN, the power supply voltage and a node N101 respectively. The gate, drain and source terminals of the MOS transistor M21 are connected to the node N101, a node N102 and ground terminal respectively. The gate, drain and source terminals of the MOS transistor M22 are connected to the node N102, the node N101 and VPP respectively. The source, gate and drain terminals of the MOS transistor M24 are connected to the node N102, ISO and OUT respectively. The substrate terminals of the MOS transistors M20 and M21 are connected to ground terminal, the substrate terminals of the MOS transistors M22 and M23 to VPP and the substrate terminal of the MOS transistor M24 to WEL.

The operation of the positive high voltage switch HVSW-1 includes the switch operations under the normal power supply voltage, a positive high voltage and negative voltage blocking. In the switch operation under the normal power supply voltage, when the power supply voltage is for example 5 V, the VPP, ISO and WEL are at 5 V, 0 V and 5 V respectively. At this time, when IN=5, the nodes N101 and N102 are at 5 and 0 respectively and the OUT is at 0 V. If IN=0, the OUT is at 5 V. In the switch operation under a positive high voltage, when the power supply voltage and VPP are for example 5 V and at 12 V respectively, the ISO and WEL are at 0 V and 12 V respectively. At this time, if IN=5 V, the nodes N101 and N102 are at 12 V and 0 V respectively and OUT=0 V. If IN=0 V, OUT=12 V. In the switch operation under negative voltage blocking, when a negative voltage is applied from the external to OUT, the node 102 is electrically insulated from OUT. When the power supply voltage and VPP are for example 5 V and at 5 V or 12 V respectively and when IN=5 V, ISO=5 V and WEL=0 V, the node N101 is at 5 V or 12 V and the node N102 is at 0 V. Even when a negative voltage is applied to OUT, the MOS transistor M24 is turned off.

Figure 7:
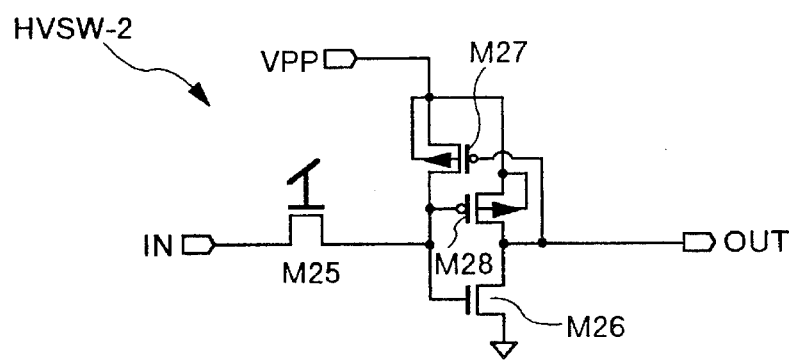
FIG. 7 is a circuit diagram of the positive high voltage switch in FIGS. 3 and 4.

FIG. 7 shows another positive high voltage switch HVSW-2. Although the transistors, input terminal and internal connection necessary for the switch operation under negative voltage blocking are omitted, the other transistors, internal connection and operation of this switch are just the same as the switch HVSW-1 of FIG. 6.

Figure 8:
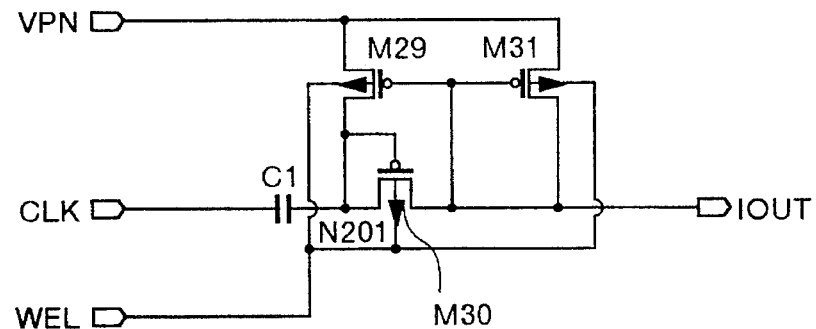
FIG. 8 is a circuit diagram of the negative voltage switch in FIGS. 2, 3 and 4.

FIG. 8 shows an example of the construction of the negative voltage switch NVSW used in the embodiment of FIGS. 2 through 5.

The negative voltage switch NVSW shown in FIG. 8 includes for example P-channel enhancement MOS transistors M29, M30 and M31, a capacitor C1, a clock input terminal CLK, a negative voltage input terminal VPN, the substrate voltage terminal WEL and an input/output terminal IOUT. The threshold of the P-channel enhancement MOS transistor is for example −0.8 V.

The internal connection of the negative voltage switch NVSW is as follows. The capacitor C1 has one end connected to the clock input terminal CLK and the other end connected to the node N201. The MOS transistor M30 has its gate and drain terminals connected to the node N201 and its source terminal connected to the input/output terminal IOUT. The MOS transistor M29 has its source terminal connected to the negative voltage input terminal VPN, its gate terminal connected to the input/output terminal IOUT and its drain terminal connected to the node N201. The MOS transistor M31 has its source terminal connected to the terminal VPN and its gate and drain terminals connected to the input/output terminal IOUT. The substrate terminals of the MOS transistors M29, M30 and M31 are connected to the substrate voltage terminal WEL.

The operation of the switch NVSW of FIG. 8 includes the switched-off state, or the case in which a positive voltage is applied to the input/output terminal IOUT and the switched-on state, or the case in which a negative voltage is applied to the input/output terminal IOUT. In the former case, the clock input terminal CLK is fixed to "L" or "H" and the negative voltage input terminal VPN and the substrate voltage terminal WEL are for example at 0 V and 5 V or 12 V respectively. At this time, even when a voltage of 5 V or 12 V is applied to the terminal IOUT, the MOS transistors M29, M30 and M31 are in the off-state so that the terminals VPN and IOUT are electrically insulated from each other. In the latter case, a clock signal (for example 30 MHz, and 5-V amplitude) is applied to the terminal CLK, a negative voltage of for example −8 V is applied to the terminal VPN and the terminal WEL is for example at 0 V. Since the node N201 is capacitance-coupled through the capacitor C1 to the terminal CLK, an electric charge according to the value of the capacitor C1 and the amplitude of the clock to CLK is induced at the node N201. Thus the voltage at the node N201 is greatly changed in the negative direction (but it is less changed in the positive direction because forward diodes relative to drains are formed in the MOS transistors M29 and M30 due to the fact that the terminal WEL is at 0 V). The terminal IOUT is opened close to 0 V when the switch starts operating. When the voltage at the node N201 becomes negative, the MOS transistor M30 is turned on so that the voltage at the terminal IOUT is changed to a negative value. Thus the MOS transistor M29 is also turned on, permitting the positive charge at the node N201 to flow to the terminal VPN in accordance with the period of the clock to the terminal CLK. This further decreases the voltage at the node N201. When the voltage at the terminal IOUT becomes equal to the voltage at the terminal VPN, the MOS transistor M29 is turned off and as a result the terminal IOUT is for example at −8 V.

The positive high voltage switch HVSW-1 of FIG. 6 can be used for the positive high voltage switches HVSW1, HVSW2 and HVSW3 shown in FIGS. 2 through 5. The positive high voltage switch HVSW-2 can be used for the positive high voltage switch HVSW4 shown in FIGS. 2 through 5. The negative voltage switch NVSW of FIG. 8 can be used for the negative voltage switches NVSW1, NVSW2 and NVSW3 shown in FIGS. 2 through 5.

The disturb verify circuit and means of this embodiment will be described below.

Figure 9:
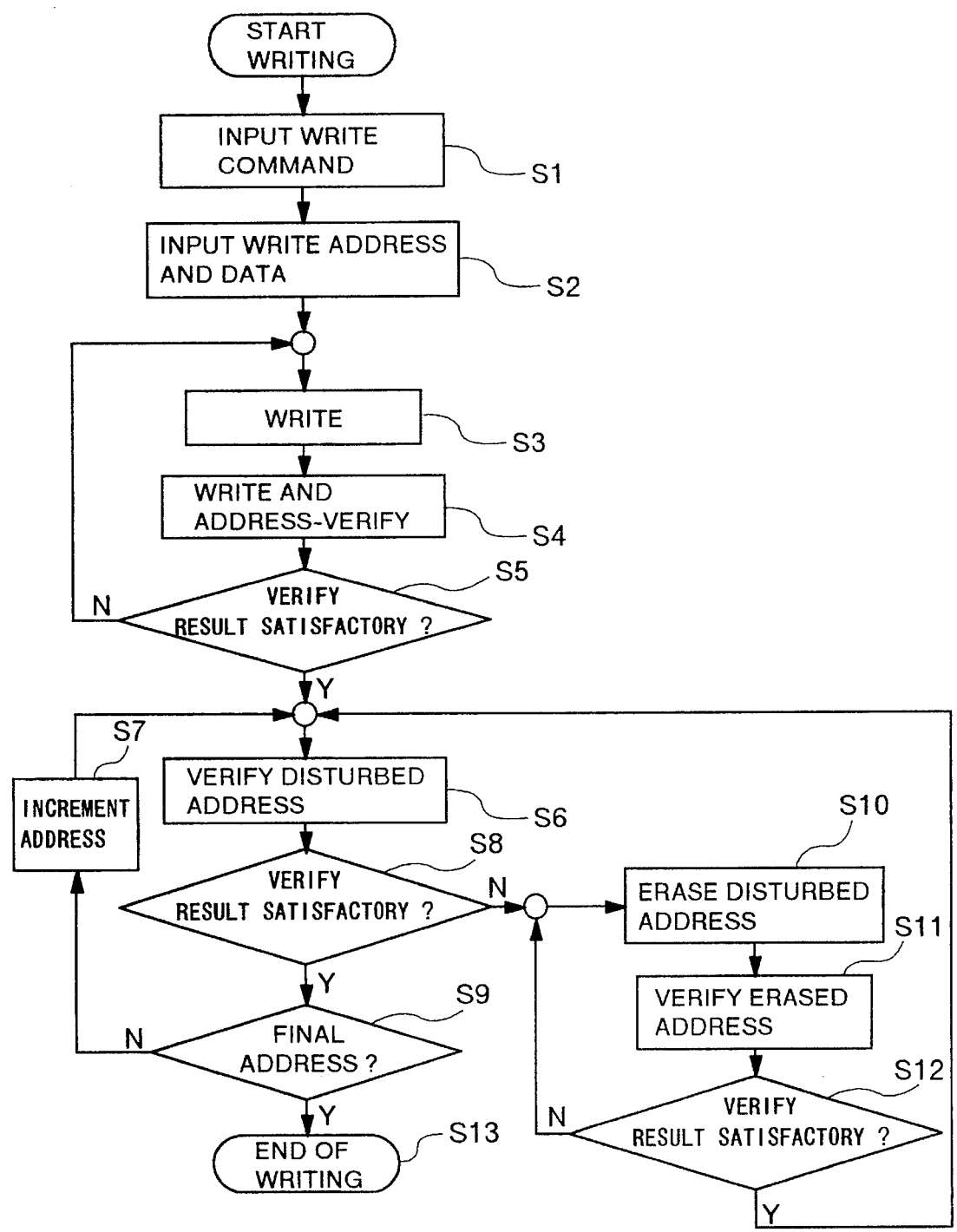
FIG. 9 is a flowchart for the writing process in the first embodiment.

FIG. 9 is a flowchart for the writing operation in this embodiment. Referring to FIG. 9, first the writing mode is brought about through the control terminal from the external and a write command is supplied to the data input terminal (step S1). Then, when a write address and data are inputted (step S2), the actual writing operation is started within the memory device (step S3). After a certain time has passed on the timer within the memory device, the writing operation ends and write verify operation is performed (step S4). If the result of the write verify operation is not satisfactory (, or if the written data and the verified data (the output SOUT of the sense amplifier in the verify mode) does not coincide with each other) (step S5), the writing operation is again carried out. If the result of the write verify operation is satisfactory (, or if the written data and the verified data coincides with each other) (step S5), the memory cell disturbed by writing is verified (step S6). This is the disturbed address verify operation. If the result of verifying all disturbed addresses is satisfactory (steps S8, S9), the writing operation ends (S13). The disturbed addresses indicate those of the memory cells connected to the same row or column as that to which the memory cell to be written is connected in the writing mode, all the memory cells which are to be erased in a block in the block erasing mode and all the memory cells belonging to a block to which the memory cell to be erased in the bit erasing mode belongs. When the result of disturb verify action is not satisfactory at a certain address, the erase mode is switched to and the corresponding memory cell is erased (step S10) (in this case, it is considered that the threshold of the fully erased memory cell is reduced by disturbing). Thereafter, the erased address is verified (step S11). If the result of the verifying action is not satisfactory (step S12), this address is again erased (step S10). If the result of verifying the erased address is satisfactory (step S12), disturbed address verifying is continued (step S6). If all disturbed address is successfully verified (steps S8, S9), the writing operation finally ends (step S13).

Figure 10:
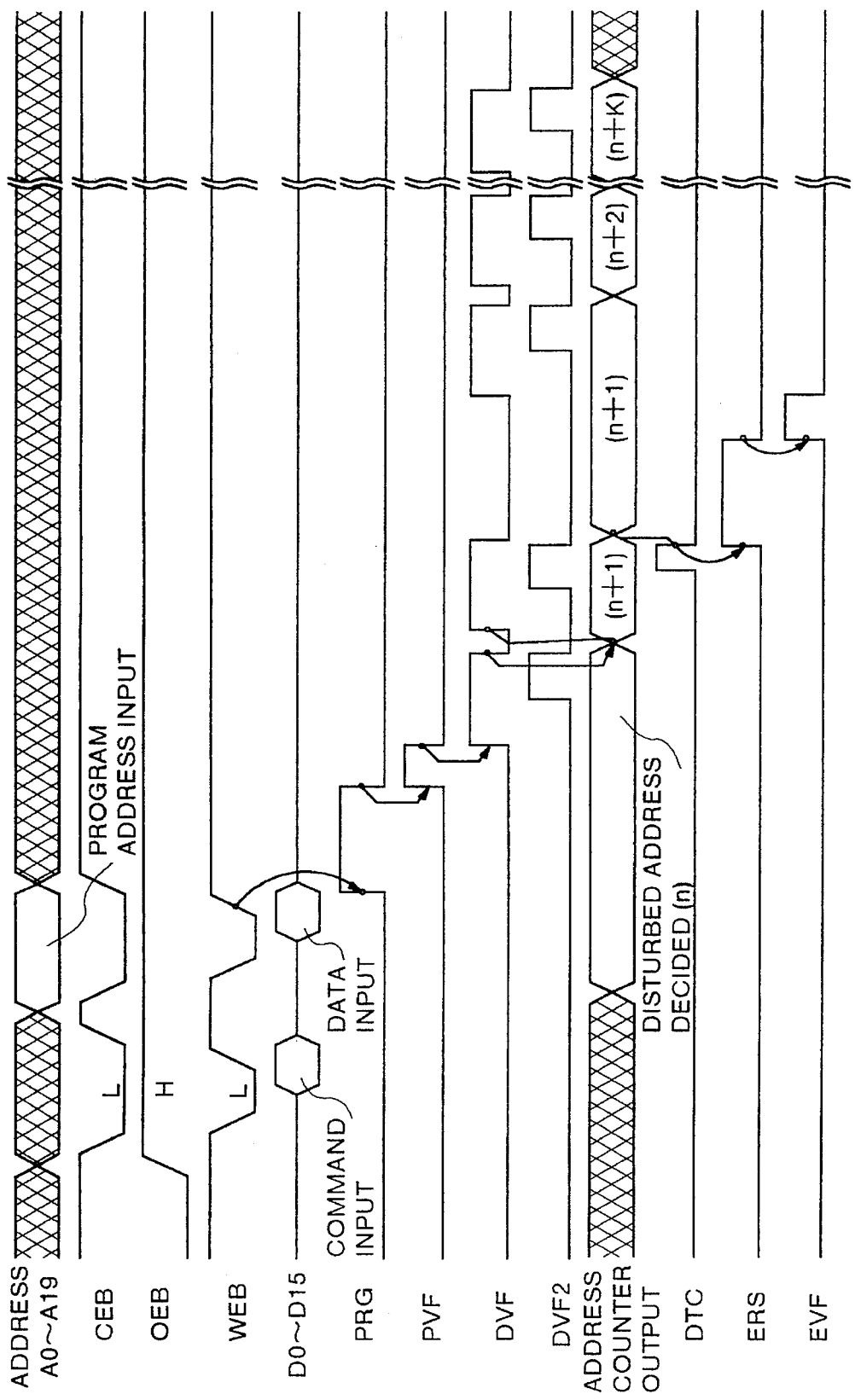
FIG. 10 is a timing chart of signals in the writing process in the first embodiment.

FIG. 10 is a timing chart to which reference is made in explaining the execution of the steps in the flowchart of FIG. 9 for the writing operation of the embodiment shown in FIG. 1. The reference characters given to the terminals, or signals in FIG. 10 are the same as in FIG. 1.

If CEB="H", OEB="L" and WEB="H", the memory device FROM of FIG. 1 is in the power-down (or standby) mode in which no address and data are accepted. In addition, data output D0 through D15 are placed in a high-impedance state. When CEB="L", OEB="H" and WEB="L", the writing mode is brought about in which a write command (, or write-in command and erase command) from the data input/output terminal D0 through D15 is accepted. If a write-in command (for example a binary number of 000000000010000) is applied to the data input/output terminal D0 through D15, data is received when WEB is changed from "L" to "H". The data is fed through the data input/output buffer DIB and appears as data (for example 000000000100000) on the internal data signal DATIN. When the control signal is in that state, this data is interpreted by the device control command discrimination circuit DVCNT and the corresponding one of a plurality of control signals CNT2 is changed from, for example, "H" to "L". The write state control circuit WCNT is responsive to this signal to prepare for latching write-in address and data. When WEB is again changed from "H" to "L", it changes the address latch signal LTA from, for example, "L" to "H", thus the address being latched. When WEB is changed from "L" to "H", it changes the data latch signal LTD from, for example, "L" to "H", thus the data being latched. At this time, the data of internal data signal DATIN is fed to the data program circuit DPRG and write-in/erase verify data coincidence detection circuit VEOR. In addition, when WEB is changed from "L" to "H", the write state control circuit WCNT changes the write-in signal PRG from, for example, "L" to "H", permitting the actual writing-in operation to start. The details of the writing-in operation are illustrated in the embodiment of FIGS. 2 through 5. Simultaneously with the start of the writing-in operation, the write state control circuit WCNT changes the timer start signal S1 from, for example, "L" to "H", thereby permitting the timer TIM to operate. At a lapse of a predetermined time (for example, one milisecond), the timer TIM changes the timer end signal S2 from, for example, "L" to "H", so that the writing-in signal PRG is changed, for example, from "H" to "L", thus permitting the actual writing-in operation to end.

The write state control circuit WCN, after the write-in signal PRG is changed from, for example, "H" to "L", changes the write-in verify signal PVF from, for example, "L" to "H", permitting the write-in verify action to start. In addition, it changes the timerstart signal S1 from, for example, "L" to "H". When the write-in verify signal PVF is changed to "H", the write-in/erase verify voltage generation circuit VFGEN generates output VVF of, for example, 2 V for write-in verify action. This voltage value is applied through the row decoder RDEC to the control gate of the written memory cell. When the threshold voltage of the memory cell is changed to 2 V or below by writing as described above, the same data as the written data is supplied from the multiplexer MPX through the sense amplifier circuit SAMP to the write-in/erase verify coincidence circuit VEOR. When the threshold voltage of the memory cell is changed to 2 V or above by writing, the sense amplifier circuit SAMP generates output SOUT of data different from the written data. When the data of SOUT is not coincident with the written data, the write-in/erase verify coincidence detection circuit VEOR changes the write-in/erase verify data output signal PENG from "L" to "H" and supplies it to the write state control circuit WCNT which then permits the writing operation to be again made. When the data of SOUT coincides with the written data, the write-in/erase verify data output signal PENG is still "L". At this time, after a certain time (for example, one microsecond) has passed on the timer TIM, the write verify signal PVF is changed from "H" to "L", and thus the write verify action ends.

Figure 11:
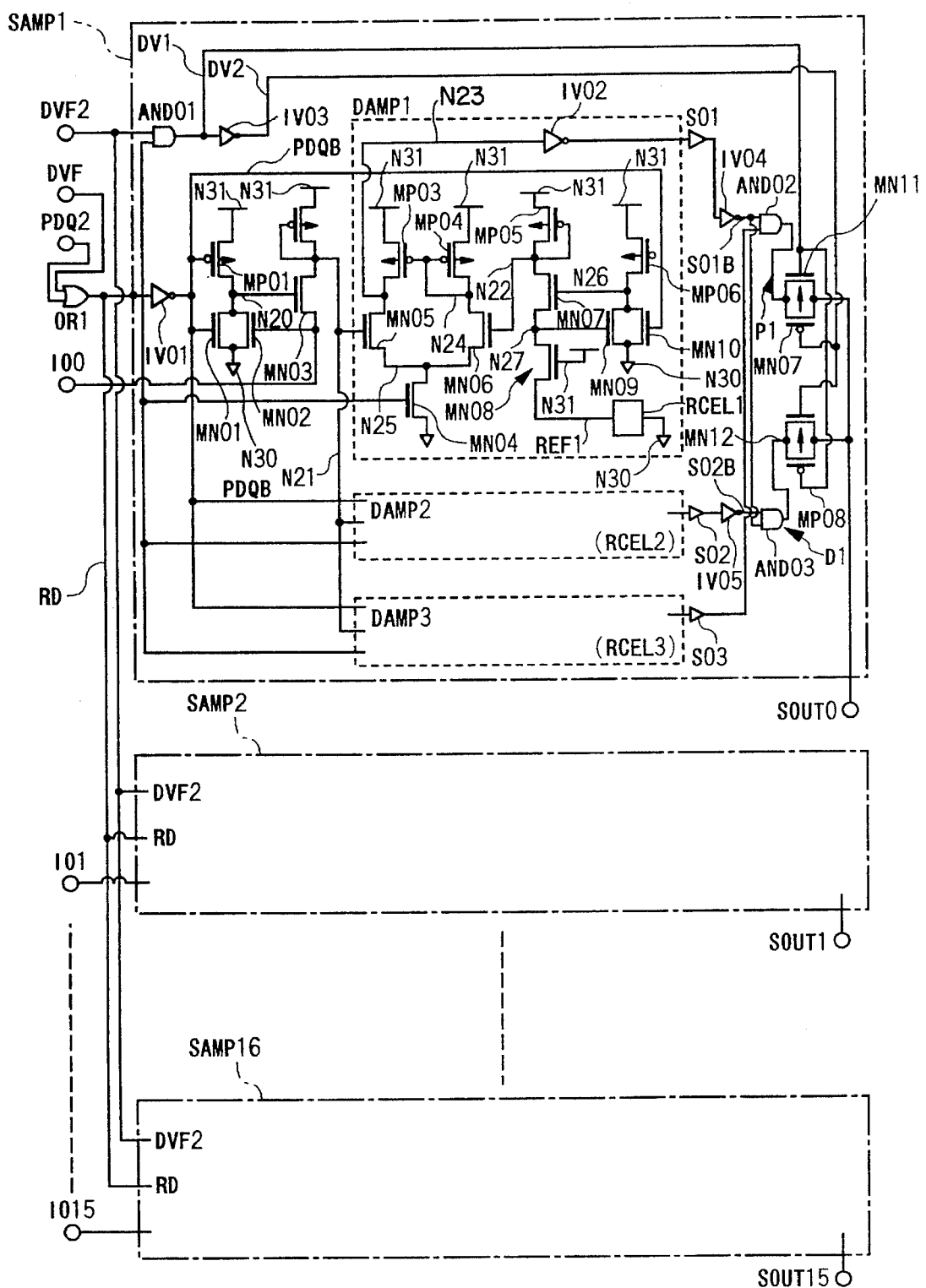
FIG. 11 is a circuit diagram of the sense amplifier in FIG. 1.

Immediately after the write verify action ends, the write state control circuit WCNT changes the disturb verify signal DVF from "L" to "H", causing the disturb verify mode to start which is the main point of this invention. At this time, the address-up counter AUPCT latches the head address of all disturbed memory cells the moment the write address is latched. If a memory cell being written is located at the third row (03h in hexadecimal notation), eighth column (008h in hexadecimal notation) within a memory cell array of, for example, 4096 word lines and 4096 bit lines, a hexadecimal value of 03000h is set in the address counter. When the disturb verify mode is started, the content of the address counter AUPCT is loaded to the address buffer ADB and the disturbed address is verified. FIG. 11 shows an example of the sense amplifier circuit including the write-in/erase disturb detection means.

Referring to FIGS. 1, 10 and 11, when the disturb verify signal DVF becomes "H", the disturb detection voltage value (for example, the same as the applied voltage in the read mode) is applied to the control gate of the memory cell at the first disturbed address. At this time, when data at the address before being disturbed is in the erased state, for example, D0 through D15=(0000000000000000) in binary notation and when the threshold voltage of that memory cell is for example 7.5 V, or is not reduced by disturbing, the sense amplifier output data SOUT 0 through 15 at DVF="H", DVE2="L" shown in FIG. 10 is (0000000000000000) and the sense amplifier output data SOUT 0 through 15 at DVF=DVF2="H", or the data for disturb detection is (0000000000000000). If the threshold voltage is reduced by disturbing (for example, when the threshold of the memory cell of one bit is reduced from 7.5 V to 6.5 V), the sense amplifier output SOUT 0 through 15 at DVF="H", DVF2="L" is (0000000000000000), but the sense amplifier output data SOUT 0 through 15 at DVF=DVF2="H", or the data for disturb detection is (0000000000000010). Therefore, the reduction of the threshold to a certain value or below by disturbing and the original value can be detected or known from the observation of the sense amplifier output data SOUT 0 through 15 at DVF="H", DVF2="L" and at DVF=DVF2="H".

In FIGS. 1, 10 and 11, the data for disturb detection are all 0, or when the threshold voltage of the memory cell is changed a certain value or below by disturbing, the disturb verify data output signal DTC remains for example "L". However, if the sense amplifier output data is 0 at DVF="H", DVF2="L" and 1 at DVF=DVF2="H", the disturb verify data output signal DTC is changed from, for example, "L" to "H". If the output signal DTC is "L", the output S3 from the timer TIM causes the address-up counter AUP to increase by one address. When the disturb verify mode is started, the timer TIM is operated by the write start signal S1 from the write state control circuit WCNT. If the output signal DTC is "H", the write state control circuit WCNT enters into the reerase mode for the address deteriorated by disturbing. In other words, the erase signal ERS is changed from, for example, "L" to "H". In the embodiment shown in FIGS. 1 and 10, the above erase operation is performed bit by bit by the circuit arrangements of FIGS. 2 through 5. By this erase operation it is possible to restore the threshold voltages of the disturbed memory cells from, for example, 6.5 V to 7.5 V. After the end of the erase operation, the write state control circuit WCNT executes the erase verify action. If the result of the verify action is satisfactory, the disturb verify mode operation is again carried out. The above operations are repeated until the final address of the address-up counter, for example, (03FFFh) in hexadecimal notation is reached, and then the disturb verify mode ends. When the disturb verify mode ends, the writing operation is finally finished.

FIG. 11 shows the details of the sense amplifier circuit in FIG. 1. The signal PDQ or DVF activates the sense amplifier circuit and the signal DVF 2 is for reading the information from which the change of the threshold voltages of the memory cells can be detected. The SOUT 0 through 15 is output data and IO1 through I015 are input signals from the internal data line. IV01, IV02, . . . , IV05 are inverters formed of MOS transistors, AND01, AND02 and AND03 are two-input logic product circuits (AND gates) formed of MOS transistors, and OR1 is a two-input logic sum circuit (OR gate) formed of MOS transistors. In addition, MP01, MP02, . . . , MP08 are P-channel enhancement MOS transistors, MN01, MN02, . . . , MN08 are N-channel enhancement MOS transistors, and RCEL1, RCEL2 and RCEL3 are reference-purpose memory cells.

In FIG. 11, N20 is connected to the drains of the transistors MP01 and MP02 and the gate of the transistor MN03. N21 is connected to the drain of the transistor MP02, the gate of the transistor MP02, the drain of the transistor MN03, the gate of the transistor MN05 and the gates of the transistors MN05 of DAMP 2 and DAMP 3. N22 is connected to the drain and gate of transistor MP05, the drain of transistor MN07 and the gate of transistor MN06. N23 is connected to the drain of transistor MP03, the drain of transistor MN05 and the input of inverter IV05. N24 is connected to the drain of transistor MP04, the drain of transistor MN06, the gate of transistor MP03 and the gate of transistor MP04. N25 is connected to the sources of transistors MN05 and MN06 and the drain of transistor MN04. N26 is connected to the drains of transistors MP06, MN09 and MN10 and the gate of transistor MN07. N27 is connected to the source of transistor MN07, the drain of transistor MN08 and the gate of transistor MN09.

DAMP1 is a circuit block including transistors MP03, MP04, MP04, MP05, MP06, MN04, MN05, MN06, MN07, MN08, MN09, MN10, inverter IV02 and reference memory cell RCEL1. DAMP2 and DAMP3 are circuit blocks having the same transistors and so on connected as does the circuit block DAMP1.

In FIG. 11, PDQ and DVF are the input to the OR gate OR1. RD is the output from the OR gate OR1 and connected to the input of the inverter IV01, the input of AND gate AND01, the gate of transistor MN04 and the gates of transistors MN04 of DAMP2 and DAMP3. The output PDQB of the inverter IV01 is connected to the gates of transistors MP01, MN01, MP06 and MN10 and the gates of transistors MP06 and MN10 of DAMP2 and MAMP3. A node IO0 is connected to the gate of transistor MN02 and the source of transistor MN03, and DVF2 is the input to the AND gate AND01. DV1 is the output from the AND gate AND01 and connected to the input of the inverter IV03 and the gates of transistors MP08 and MN11. DV2 is the output from the inverter IV03 and connected to the gates of transistors MP07 and MN12. SOUT0 is connected to the drains of transistors MP07, MP08, MN11 and MN12. SO1 is the output from the inverter IV02 of DAMP1 and the input to the inverter IV04. S02 is the output from the inverter IV02 of DAMP2 and the input to the inverter IV05. SO3 is the output from the inverter IV02 of DAMP3 and the input to the AND gate AND02. SO1B is the output from the inverter IV04 and the input to the AND gates AND02 and AND03. S02B is the output from the inverter IV05 and the input to the AND gate AND03. D1 is the output from the AND gate AND03 and connected to the sources of transistors MN12 and MP08. P1 is the output from AND gate AND02 and connected to the sources of transistors MN11 and MP07. REF1 is connected to the source of transistor MN08 of DAMP1 and the drain of reference memory cell RCEL1. REF2 and REF3 are connected to the source electrodes of transistors MN08 of DAMP2 and DAMP3 and the drain electrodes of reference memory cells RCEL2 and RCEL3, respectively. N30 is a grounded node and connected to the grounded nodes of the inverters and AND gates, the source electrodes of transistors MN01, MN02, MN04, MN09, MN10 and the source electrodes of reference memory cells RCEL1, RCEL2 and RCEL3. N31 is a power supply node and connected to the power supply nodes of the inverters and AND gates, the source electrodes of transistors MP01, MP02, MP03, MP04, MP05 and MP06 and the gate of transistor MN08.

SAMP1 is a circuit block which includes transistors MP01, MP02, MP07, MP08, MN01, MN02, MN03, MN11 and MN12, circuit blocks DAMP1, DAMP2 and DAMP3, inverters IV01, IV03, IV04 and IV05 and AND gates AND01, AND02, AND03. The circuit blocks SAMP 2 through 16 have the same circuit arrangement as SAMP1 and have outputs SOUT 1 through 15, respectively.

In FIG. 11, when PDQ or DVF becomes "H" voltage, RD is "H" and IO0 is at the same potential as the column line of the selected memory cell. Since PDQB becomes "L" voltage, the transistor MP01 is turned on, transistor MN01 off so that the voltage of N20 is raised from 0 V. When the voltage of N20 is increased, the transistor MN03 is turned on, thus the node IO0 being at the voltage of N20 minus the threshold voltage of transistor MN03. However, when the voltage at the node IO0 becomes higher than the threshold voltage of the transistor MN02, the transistor MN02 is made on, suppressing the potential of node IO0 from increasing. Therefore, when PDQ becomes "H", the node IO0 is at around the intermediate value between 0 V and the power supply voltage, for example, 2 V. At this time, if the memory cell being read is in the on-state, current flows from the node IO0 to the source of the memory cell with the result that the potential at IO0 is slightly lowered to, for example, 1.8 V. Since the current supply for this is made through the transistor MP02, the voltage of N21 is greatly reduced as compared to that of IO0, for example, from 4.2 V to 3.5 V by properly selecting the size of the transistor MP02. In addition, since the voltage of N21 is also proportional to the amount of current flowing in the memory cell, the transistors MP01, MP02, MN02 and MN03 amplify the potential variation of IO0. The transistors MP03, MP04, MN04, MN05 and MN06 constitute a differential amplifier and N21 and N22 are a differential input thereto. The circuit consisting of the transistors MP05, MP06, MN07, MN09 and MN10 is analogous to that of the transistors MP01, MP02, MN01, MN02 and MN03 and acts on REF1 as does IO0. The transistor MN08 acts to transmit the potential of REF1 to N27. Reference characters IO1 through IO15 are nodes of SAMP 2 through 16 corresponding to IO0 of SAMP1, respectively.

If the threshold voltage of the memory cell being read is for example 3 V and the threshold voltages of the reference cells RCEL1 through RCEL3 are for example 7 V, 4.5 V and 2 V respectively, the following condition can be obtained:

Voltage of REF3<voltage of IO0<voltage of REF2<voltage of REF1.

In addition, SO1 and SO2 are "L" voltage and SO3 is "H" voltage. The threshold voltages of the reference memory cells are previously set in a test mode or the like and will not described in detail in this embodiment. D1 is "H" voltage and P1 is "H" voltage. When DVF and DVF2 are "H" and "L" respectively, the sense amplifier circuit is in the reading mode in which the data written in the memory cell is read. Data of D1 is fed to SOUT0 and making it "H" voltage. When both DVF and DVF2 are "H" voltage, the sense amplifier circuit is made in the reading mode for reading the information from which the threshold change of the disturbed memory cell can be detected. Data of P1 is fed to SOUT0, making it for example "H" voltage. SAMP2 through SAMP16 make the same operation.

Figure 13:
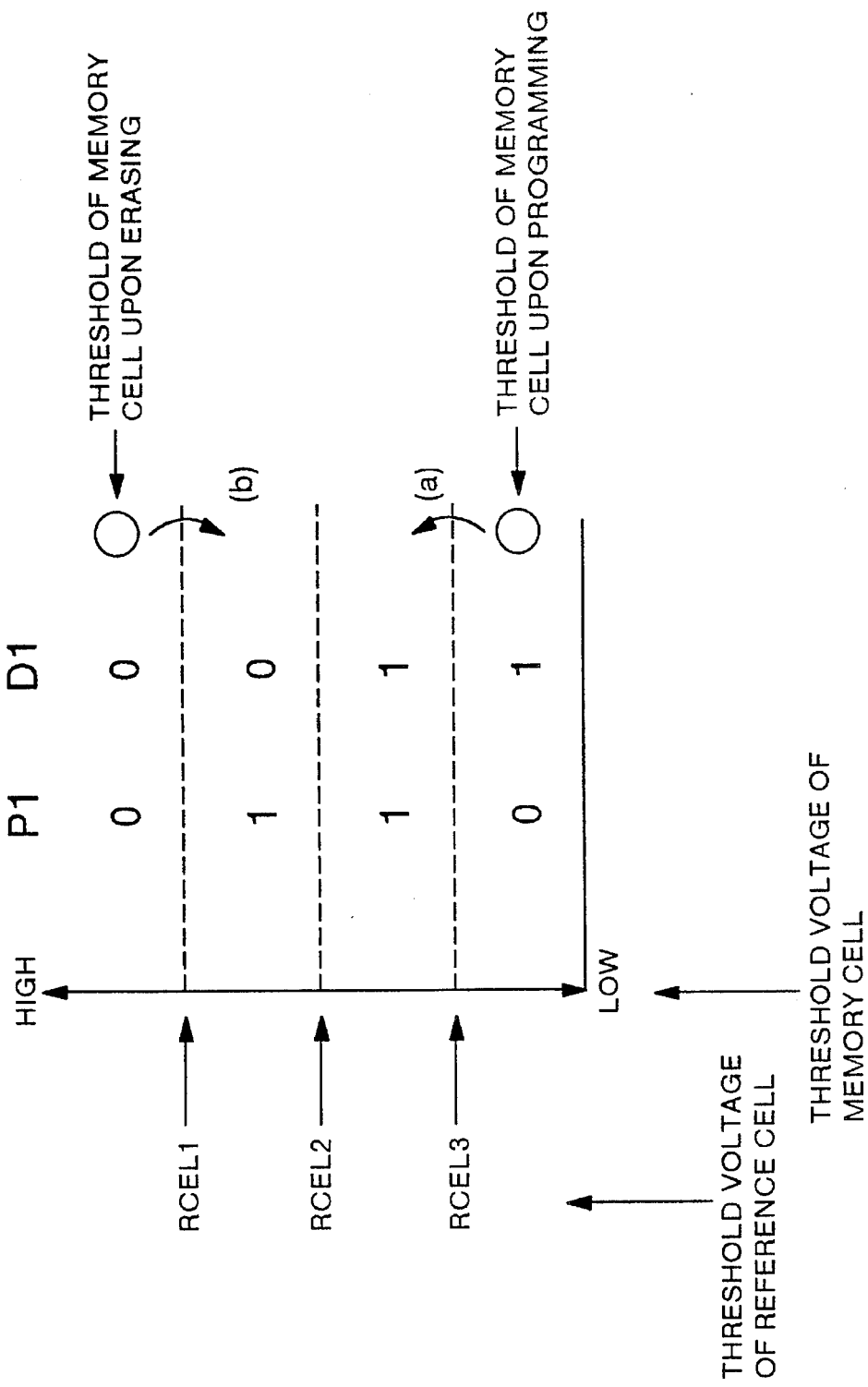
FIG. 13 is a diagram showing the relation between the read data and the threshold of memory cell in the sense amplifier in the first embodiment.

FIG. 13 shows the relation of the threshold voltage of the memory cell and 2-bit data read from nodes P1 and D1 in FIG. 11. In FIG. 13 the threshold is shown to increase in the upward direction. Different threshold voltages which are respectively written in the memory cell upon programming and erasing are indicated at small circles ○. From FIG. 13 it will be found that there are three threshold levels of reference cells between the values indicated by the small circles ○. The reason for this is that the threshold voltage stored in the memory cell is changed to the level of the neighboring one, the threshold level of the memory cell can be restored to the original level. However, if the threshold voltage stored in the memory cell is changed up over the level of RCEL1 or down below the level of RCEL3, the data written in the memory cell is never changed when reading regardless of the threshold voltage change. Thus it is not necessary to provide any threshold detection level above RCEL1 or below RCEL3.

The method for detecting the disturbed state of the memory cell will be described with reference to FIG. 13.

It is assumed that the threshold voltage of a certain memory cell immediately after being erased is higher than that of reference cell RCEL1. When the threshold voltage of this memory cell remains higher than that of RCEL1 at the time of disturb verify action, the data D1 read from the memory cell when the data written in the memory cell is read is "L" voltage and the data P1 read as the information for detecting the disturbed memory cell is "L" voltage. When the threshold voltage of the memory cell is decreased to a value between the threshold voltages of reference cells RCEL1 and RCEL2, as shown at (b) in FIG. 13, lower than that in the erased state due to, for example, loss of electric charge, the data D1 is "L" voltage and data P1 is "H" voltage. When the threshold voltage of the memory cell is initially lower than that of reference cell RCEL3 but increased upon programming to a value between the threshold voltages of reference cells RCEL2 and RCEL3, as shown at (a) in FIG. 13, due to, for example, injection of electric charge, the data D1 is "H" voltage and data P1 is "H" voltage.

In this manner, by providing three reference threshold levels by the reference cells, the data obtained when reading out one-bit data stored in the memory cell is unchanged even when the threshold of the memory cell is changed to an adjacent threshold level. But, it is possible to detect variation of the threshold voltage by reading out information for detection of the memory cell disturbance, in advance of variation of the data as obtained from reading out of the memory cell due to disturbance thereof. In this embodiment, the data P1 of "L" indicates no disturbance and the data P1 of "H" indicates an occurrence of disturbance. In a memory device constructed so that data of three or more values can be written in each memory cell, an intermediate threshold level is provided between each of the threshold voltages corresponding to three values of data and the reference voltage level for detecting the threshold voltage.

The operation of the device of this embodiment at the time of inputting a write command has been described. The operation at the time of applying an erase command is also substantially the same.

Figure 12:
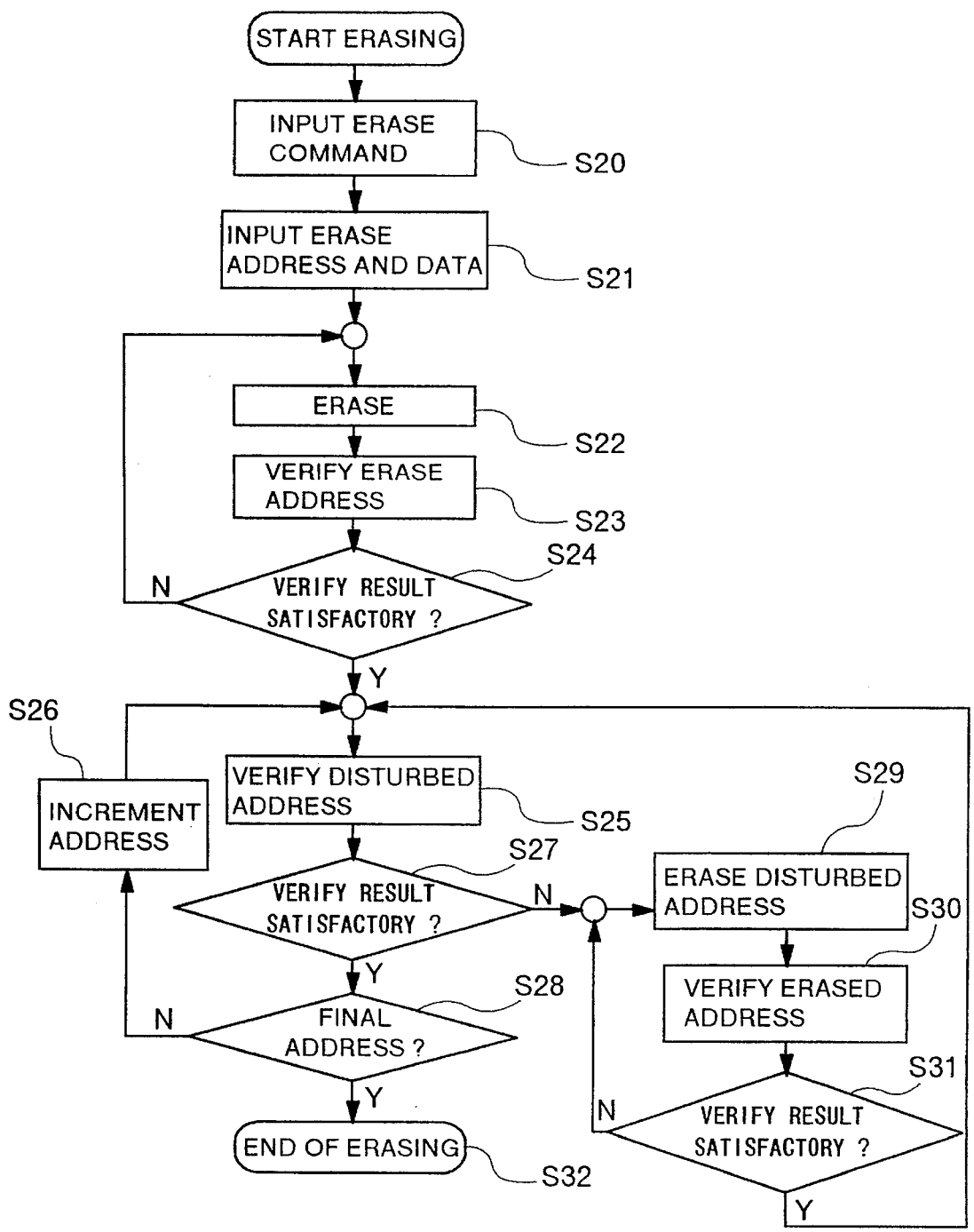
FIG. 12 is a flowchart for the erasing process in the first embodiment.

FIG. 12 is a flowchart for the operation of the device of this embodiment at the erasing time. Referring to FIG. 12, first the erasing mode is brought about through the control terminal from the external and an erase command is supplied to the data input terminal (step S20). Then, when an address for erasing is applied (step S21), the memory device starts the actual erasing operation (step S22). After a certain time has passed on the timer within the memory device, the erasing operation ends and the erase verify action is made (step S23). If the result of the erase verify action is not satisfactory (or when erased data and verified data does not coincide with each other) (step S24), the erasing operation is again performed (step S22). When the result of the erase verify action is satisfactory (, or when the erased data and the verified data coincides with each other) (step S24), the memory cell disturbed by erasing is verified (step S25). This is the disturbed address verifying action. If the result of verifying all the disturbed address is satisfactory (step S27, S28), the erasing operation ends (step S29). If the result of verifying a disturbed address is not satisfactory (step S27), the erasing mode is again switched to and the unsatisfactory memory cell is erased (step S29) (in this case, it is considered that the threshold of the completely erased memory cell is reduced by disturbing). Thereafter, the erased address is verified (step S30). If the result of verifying is not satisfactory (step S31), the address is again erased (step S29). If the result of verifying is satisfactory (step S31), the disturbed address verifying action is continued (step S25). When all the disturbed address is successfully verified (step S27, S28), the erasing operation finally ends (step S29). Although the above operations will not be mentioned in detail with reference to a timing chart, it will be found from the above embodiment that these operations can be realized with ease.

Although the disturb detection circuit and means in this embodiment makes correction for the reduction of the threshold of the memory cell due to disturbance, it will be easily understood that the same circuit and means without departing from the scope of the invention can make correction for the increase of the threshold of the memory cell due to disturbance.

Moreover, while the sense amplifier circuit of this embodiment can produce only either one of the stored information of the memory cell (D1 in FIG. 1) and the disturbance detecting data (P1 in FIG. 11), the sense amplifier circuit may be constructed to produce both D1 and P1 in FIG. 11 and so that the stored information of the memory cell and the disturbance detecting data can be simultaneously supplied to the disturb verify data detection circuit DVFC in FIG. 1.

Figure 14:
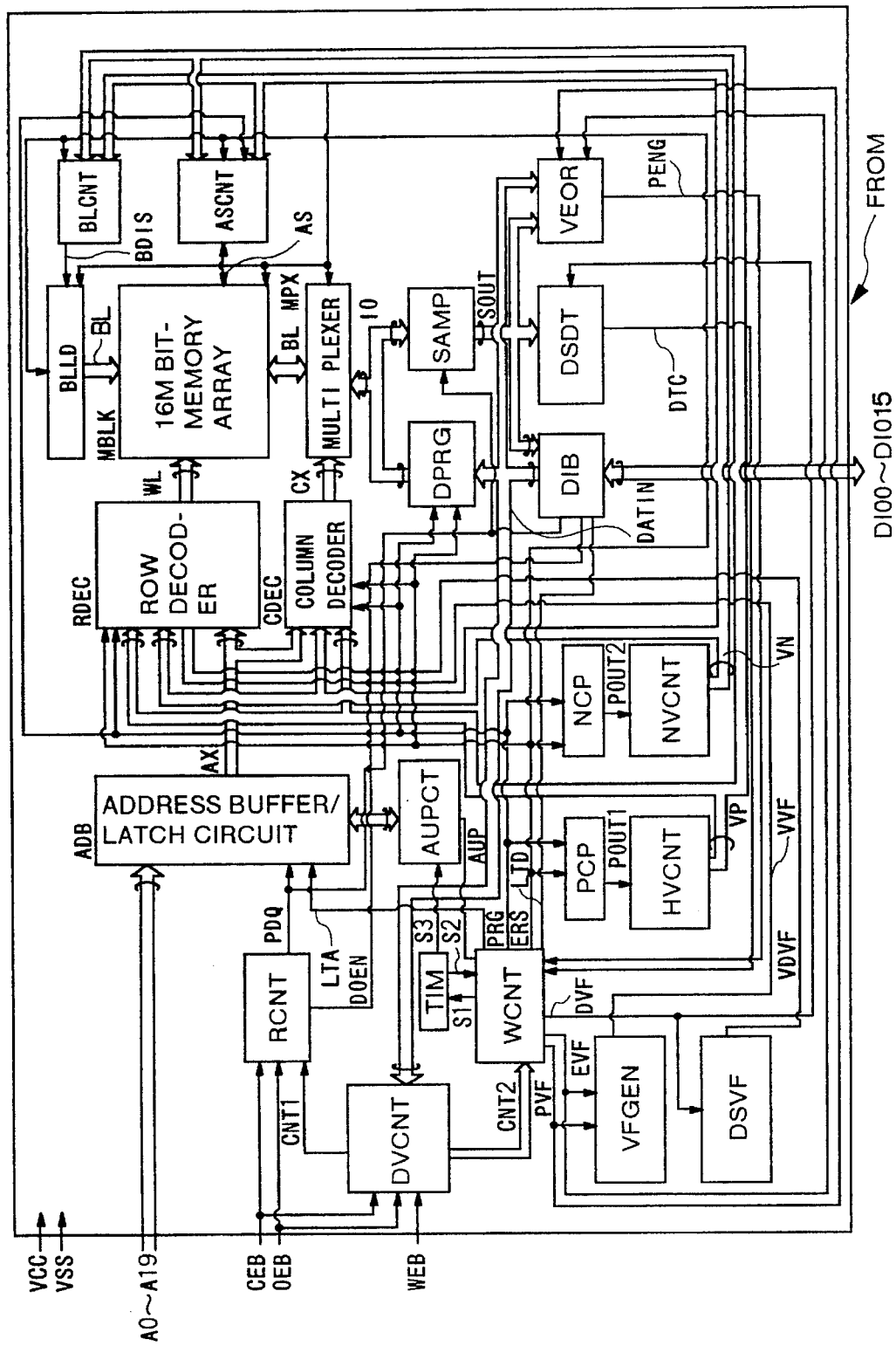
FIG. 14 is a circuit block diagram of the second embodiment of the invention.

FIG. 14 is a circuit block diagram of the second embodiment of the invention. This second embodiment is different from the first embodiment in that a write-in/erase disturb detection voltage generation circuit DSVF is provided in the second embodiment. The write-in/erase disturb detection voltage generation circuit DSVF receives the disturb verify signal DVF from the write state control circuit WCNT and supplies a disturb verify voltage signal VDVF to the row decoder RDEC. The construction of the sense amplifier circuit SAMP is modified as in the prior art according to the addition of this new circuit, so that the disturb verify operation is changed as follows. The other points are the same as in the first embodiment.

Figure 15:
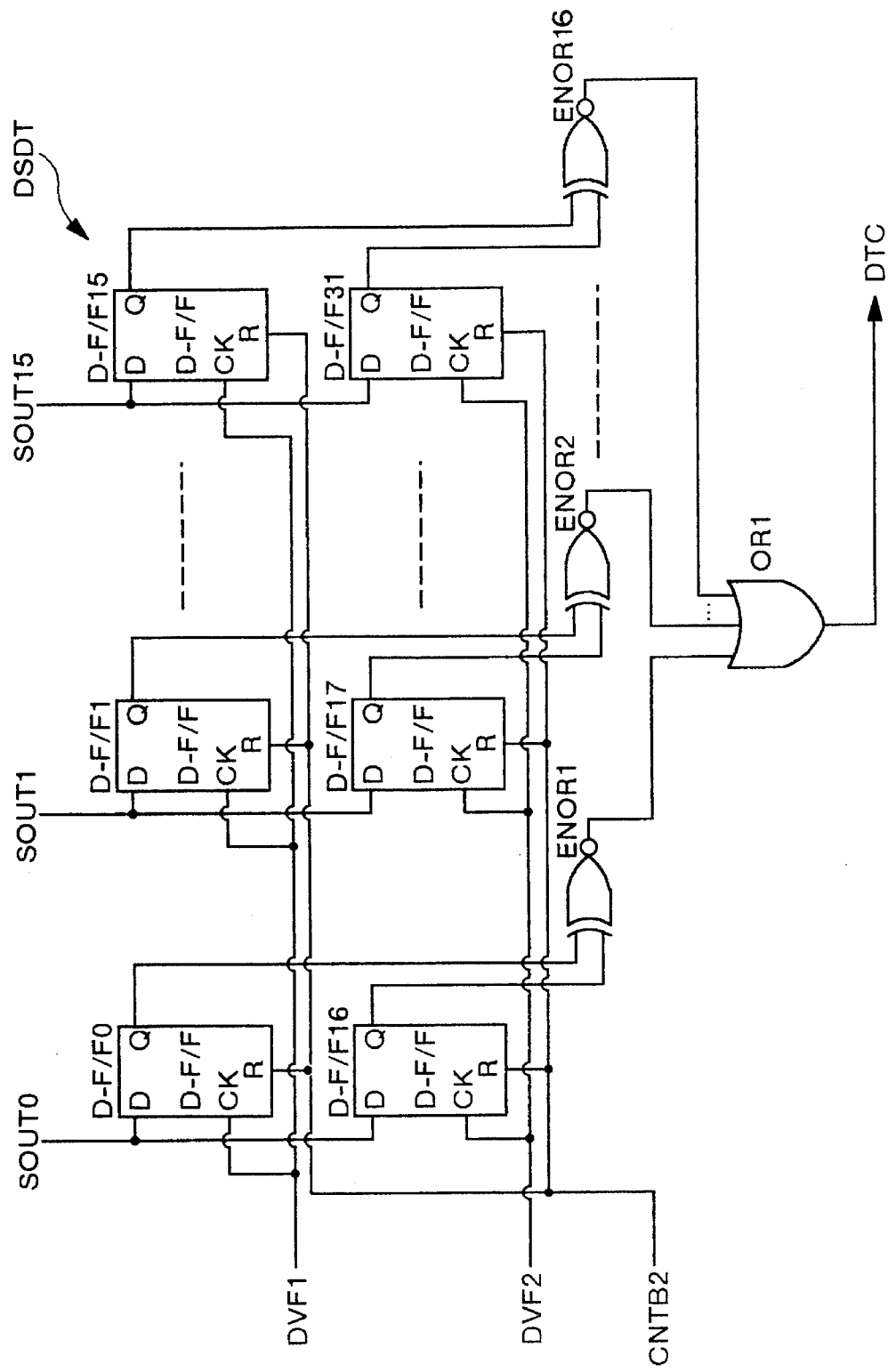
FIG. 15 is a detailed block diagram of the disturb detection circuit in the second embodiment.
Figure 16:
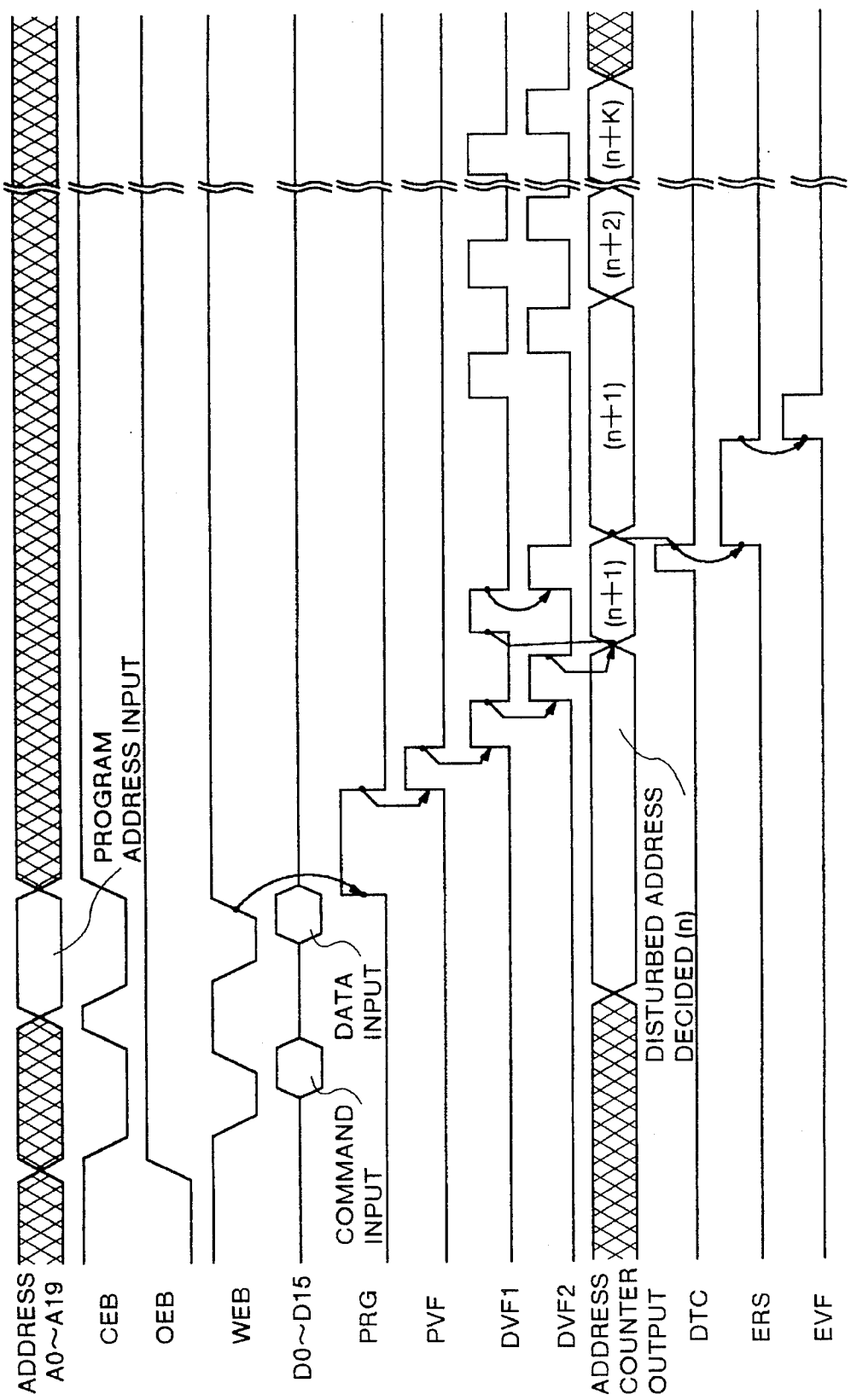
FIG. 16 is a timing chart of signals in the writing process in the second embodiment.

FIG. 15 shows an example of the arrangement of the write-in/erase disturb detection voltage generation circuit DSVF. FIG. 16 is a timing chart of the operation of this embodiment. In this embodiment, as illustrated in FIG. 16, the disturb verify signal DVF is produced in the form of two separate signals DVF1 and DVF2. When one signal DVF1 is supplied to the write-in/erase disturb detection voltage generation circuit DSVF, a first disturb verify voltage value (for example, 6 V) is produced as the disturb verify voltage signal VDVF. When the other signal DVF2 is supplied thereto, a second disturb verify voltage value (for example, 7 V) is produced as the disturb verify voltage signal VDVF.

In FIG. 15, DSDT is a disturb data detection circuit and D-F/F0, D-F/F1, ..., D-F/F31 are synchronizing-type data input flip-flops each of which has a reset input end. The data input to a terminal D is transferred to a terminal Q at the edge of the change from "H" to "L" of a clock CK. ENOR1, ENOR2, ..., ENOR15 are two-input exclusive NOR gates which produce "L" when the two input data are coincident but "H" when they are not coincident. OR1 is a 16-input OR gate. In FIG. 11, the disturb verify signal DVF1 is supplied to the CK-terminals of the flip-flops D-F/F0, F-F/F1, ..., D-F/F15 and signal DVF2 to the CK-terminals of the flip-flops D-F/F16, D-F/F17, ..., D-F/F31. The sense amplifier output signal SOUT0 is supplied to the D-terminals of the flip-flops D-F/F0 and D-F/F16, the signal SOUT1 to the D-terminals of the flip-flops D-F/F1 and D-F/F17, ..., the signal SOUT15 to the D-terminals of the flip-flops D-F/F15 and D-F/F31. A reset signal CNTB2 is supplied to the reset terminals R of the flip-flops D-F/F0, D-F/F1, ..., D-F/F31. A signal CNTB2 is turned "L" when the write command is fed, and "H" when the disturb verify action ends.

The flowchart for the disturb verify operation of this embodiment is the same as in FIG. 9. In FIGS. 15 and 16, when the signal DVF1 becomes "H", the first disturb detection voltage value (for example, 6 V) is applied to the control gate of the disturbed memory cell at the first address. When the signal DVF2 becomes "H", the second disturb detection voltage value (for example, 7 V) is applied to the control gate of the disturbed memory cell at the first address. At this time, it is assumed that the data at the address before being disturbed is in the erased state, for example, D0 through D15=(1111111111111111) and that the threshold voltage of that memory cell is for example 7.5 V. When the threshold voltage is not reduced by disturbing, the output data SOUT from the sense amplifier is (1111111111111111) when the first and second disturb detection voltages are applied. However, when the threshold voltage is reduced by disturbing (for example, when the threshold of the one-bit memory cell is reduced from 7.5 V to 6.5 V), the output data SOUT from the sense amplifier at the first disturb detection voltage is (1111111111111111) and that at the second disturb detection voltage value is for example (1111111111111101). Therefore, from the fact that the output data from the sense amplifier at the first disturb detection voltage value is coincident with that at the second disturb detection voltage value, it is possible to detect that the threshold has been reduced by a constant value or above.

In FIGS. 14, 15 and 16, when the output data from the sense amplifier at the first disturb detection voltage value is coincident with that at the second disturb detection voltage value, the disturb verify data output signal DTC remains for example "L". If they are not coincident with each other, the disturb verify data output signal DTC is changed from, for example, "L" to "H". When the signal DTC is "L", the output S3 from the timer TIM is fed to the address-up counter AUP, increasing its content by one address. When the disturb verify mode is started, the timer TIM responds to the timer start signal S1 from the write state control circuit WCNT to start operating. When the signal DTC is "H", the write state control circuit WCNT enters into the mode for reerasing the address degraded by disturbing. In other words, the erase signal ERS is changed from, for example, "L" to "H". In this embodiment, erasing is made bit by bit as in FIGS. 2 through 5. This erasing operation makes the threshold voltage of the disturbed memory cell be restored from, for example, 6.5 V to 7.5 V. After the end of the erasing operation, the write state control circuit WCNT performs the erase verify action. If the result of verify action is satisfactory, the disturb verify mode operation is again carried out. The above operations are repeated until the final address of the address-up counter, for example, (03FFFh) in hexadecimal notation is reached, and then the disturb verify mode ends. When the disturb verify mode ends, the writing operation finally ends. The same operations are made for the erase command.

According to the main points of this invention, the array and construction of memory cells in this embodiment may be modified, for example, a plurality of memory source lines may be provided and decoded by signals from the column decoders.

While a kind of writing system and two kinds of erasing system are shown in this embodiment, the writing and erasing systems are particularly not necessary to be specified.

Moreover, while in this embodiment the memory cell of which the threshold voltage is changed by disturbing is restored to the original state by erasing, the voltage value applied to the memory cell may be different from that in the actual erasing operation. In the actual erasing operation, the threshold of the memory cell is changed from, for example, 2 V to 7.5 V. The threshold of the disturbed memory cell may be restored by changing the value from, for example, 6.5 V to 7.5 V. The voltage value may be lower than in the actual erasing operation. In addition, the shape of the memory cells may be arbitrary.

Furthermore, the embodiments of this invention may be added with another function for the writing or erasing operation flow. The present invention is particularly not limited to the voltage values used in the embodiments of this invention, but may use arbitrary voltage values unless they ruin the operations of this invention.

According to the above embodiments of the electrically writable or erasable nonvolatile semiconductor memory device of the invention, the disturbed memory cell can be detected and restored by electrical means before the data is destroyed by disturbing and thus the resistance to the disturbance can be greatly improved. In other words, threshold voltage detection levels are provided the number of which is at least twice or three times as large as the minimum number of the detection levels necessary for reading the stored information of the memory cells, and those detection levels are compared to the threshold voltages of the memory cells so that the stored information of the memory cells and the disturbance detection data can be known at a time. Therefore, the nonvolatile semiconductor memory device is able to simultaneously read information and detect the disturbance.

In addition, the final resistance-to-disturbance time is represented by the resistance-to-disturbance time in the conventional circuit multiplied by the possible number of times of operation for restoration. The possible number of times of operation for restoration is equal to or more than the number of times the memory cell can be rewritten. Thus, when the resistance-to-disturbance time in the conventional circuit is one second and the possible number of times in rewriting of the memory cell is a hundred thousand, the resistance-to-disturbance time is a hundred thousand seconds. From this it will be found that there is enough spare time even for sector erasing.

Moreover, the optimization and manufacturing method for memory cells as in the prior art are not necessary to devise and the resistance to disturbance can be greatly improved. Thus the nonvolatile semiconductor memory device of the invention can be greatly improved in reliability to the retaining of data. Also, if the memory device is produced in order that a lower supply voltage can be used for writing or erasing of memory cells, the resistance-to-disturbance time is normally reduced as described in the document 3. However, since the resistance-to-disturbance time can be extended by this invention, the operation under a lower power supply voltage can be guaranteed.

Figure 17:
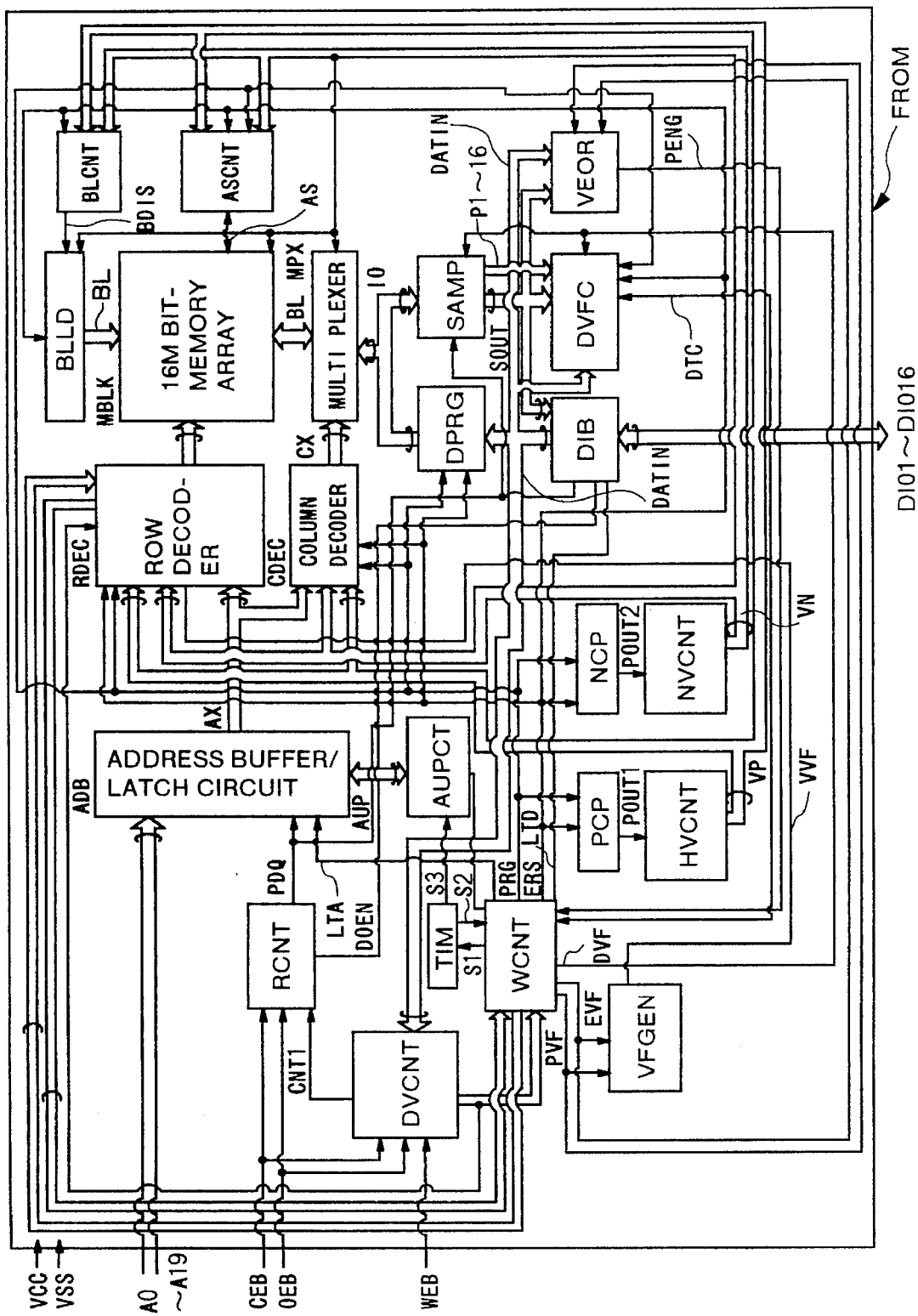
FIG. 17 is a circuit block diagram of the third embodiment of the invention.

FIG. 17 is a circuit block diagram of the third embodiment of the invention. In FIG. 17, FROM is an electrically alterable nonvolatile semiconductor memory device having a memory capacity of, for example, (1048576 words×16 bits=16777216 bits). The address input A0, A1, . . . , A19, chip enable signal CEB, output enable signal OEB, write enable signal WEB, power supply voltage VCC and ground potential VSS are input signals from the outside of FROM. The input/output data DIO1 through DIO16 are input data from the outside in writing and erasing and output data to the outside in reading. The embodiment shown in FIG. 17 has not only the circuits for writing and erasing but also the verify circuits for writing in and erasing and for disturbance.

Referring to FIG. 17, DVCNT is a device control command discrimination circuit receives the write enable signal WEB for the operation mode of FROM, chip enable signal CEB, output enable signal OEB and a plurality of internal input data DATIN and produces the control signal CNT1 and a plurality of control signals CNT2 (including the start signal DVFST for the disturb verify mode). For example, the control signal CNT2 includes control signals for the writing-in mode, erasing mode or the mode for detection of disturbed state and restoration of threshold voltage (=disturb verify mode).

RCNT is a chip/output selection state control circuit which receives the chip enable signal CEB, output enable signal OEB and control signal CNT1 for control and produces the power-down signal PDQ and output buffer activation signal DOEN.

The write state control circuit WCNT receives CNT2, the timer end signal S2, disturb verify data output signal DTC, write-in/erase verify data output signal PENG and output from counter circuit (hereinafter, counter output) CT for control and produces the write signal PRG, erase signal ERS, write verify signal RVF, erase verify signal EVF, disturbed data verify signal DVF, address counter-up signal AUP, timer start signal S1, address latch signal LTA, data latch signal LTD and reset signal (hereinafter, counter reset signal) RST to counter circuit.

The timer circuit TIM is responsive to the timer start signal S1 from the write state control circuit WCNT to, a predetermined time later, supply the address-up clock signal S3 to the address-up counter AUP and the timer end signal S2 to the write state control circuit WCNT.

The row decoder RDEC receives the internal address signal AX, write signal PRG, erase signal ERS, a plurality of high voltage signals VP, a plurality of negative voltage signals VN and write-in/erase verify voltage signal VVF and produces a plurality of (for example, 4096) word line signals WL. The row decoder RDEC includes a circuit for counting the number of times each word line is selected. This circuit receives the write signal PRG, erase signal ERS, disturb verify start signal DVFST, reset signal RST and decode signal (corresponding to N1 in FIG. 2) and produces a counter output CT, or the information (count information) of whether the number of times each word line is selected is larger than a certain number of times or not.

The sense amplifier circuit SAMP receives the data of internal data line IO and the power-down signal PDQ and disturb verify data output signal DVF for control and produces the sense amplifier output signal P1 through P16 and SOUT (D1 through D16).

The circuit arrangements of the address buffer/latch circuit ADB, column decoder CDEC, memory block MLBK, multiplexer MPX, write-in/erase verify voltage generation circuit VFGEN, positive high voltage charge circuit PCP, positive high voltage control circuit HVCNT, memory cell array source line control circuit ASCNT, bit line voltage control circuit BLCNT, bit line load circuit BLLD, disturb data detection/correction circuit DVFC, write-in/erase verify data coincidence detection circuit VEOR, data input/output buffer DBI and data rewrite circuit DPRG are the same as in the first embodiment and will not be described.

Figure 2:
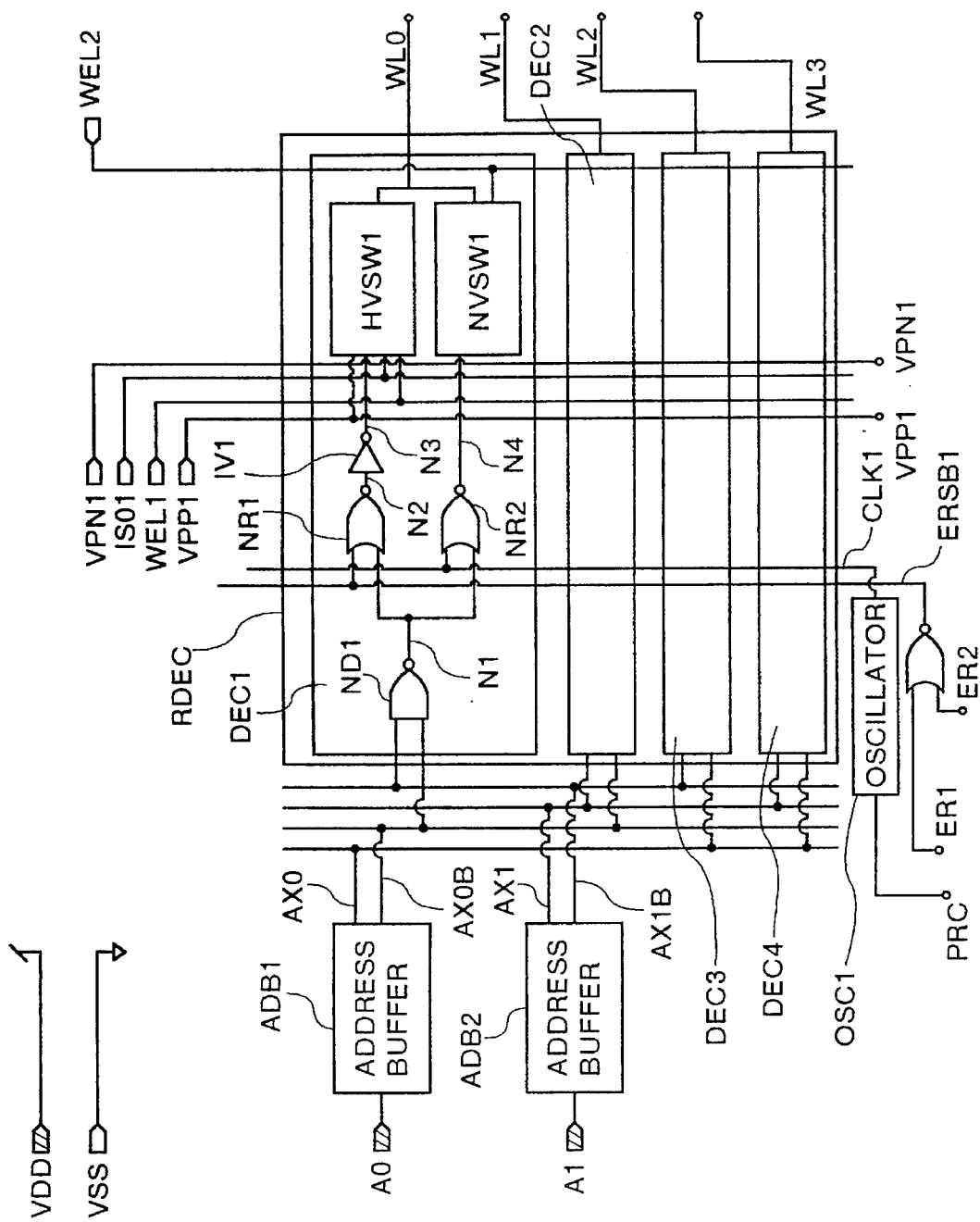
FIGS. 2 to 5 are detailed circuit block diagrams, respectively, of the four divisions of the circuit arrangement of FIG. 1.
Figure 3:
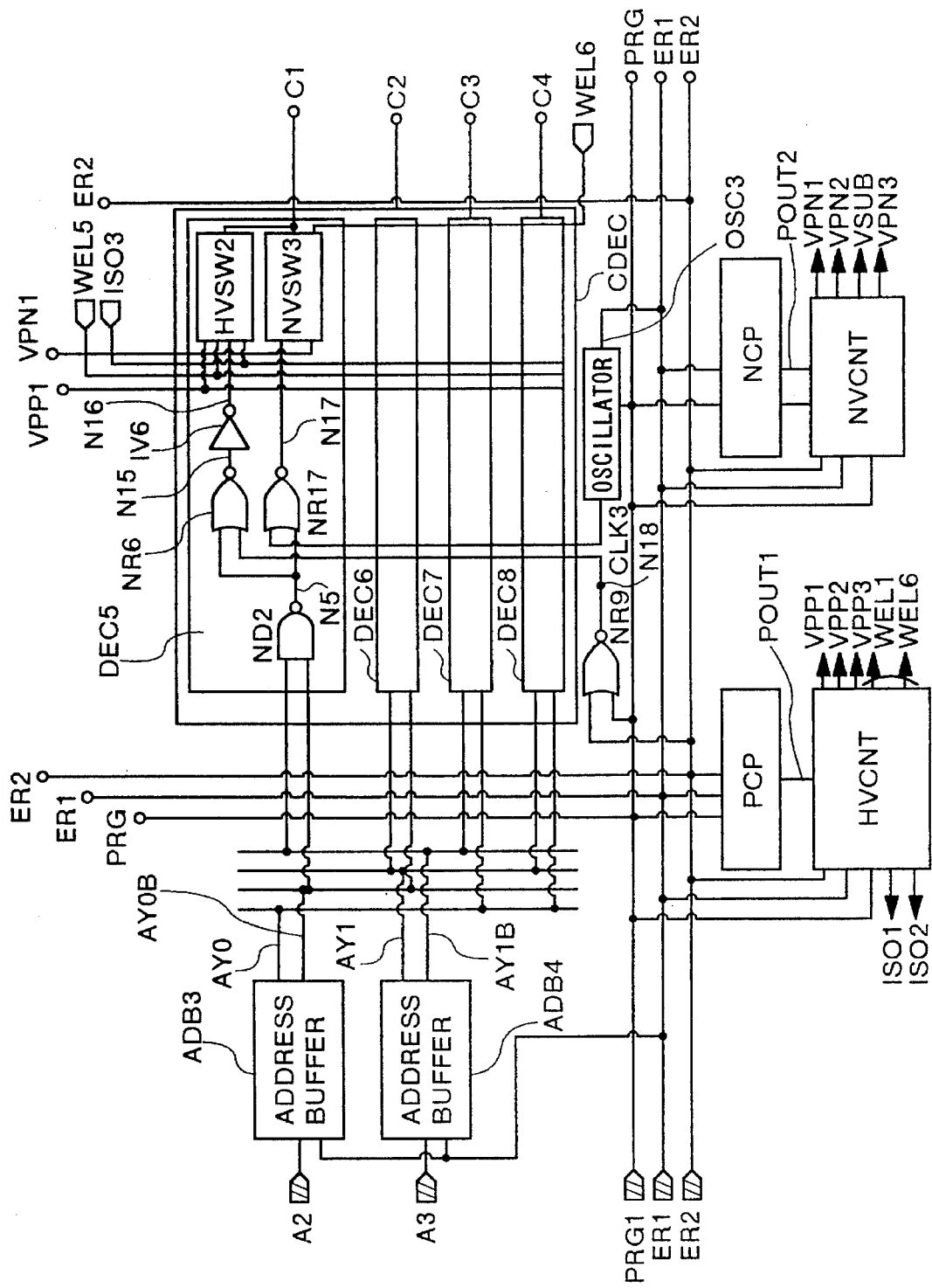
Figure 4:
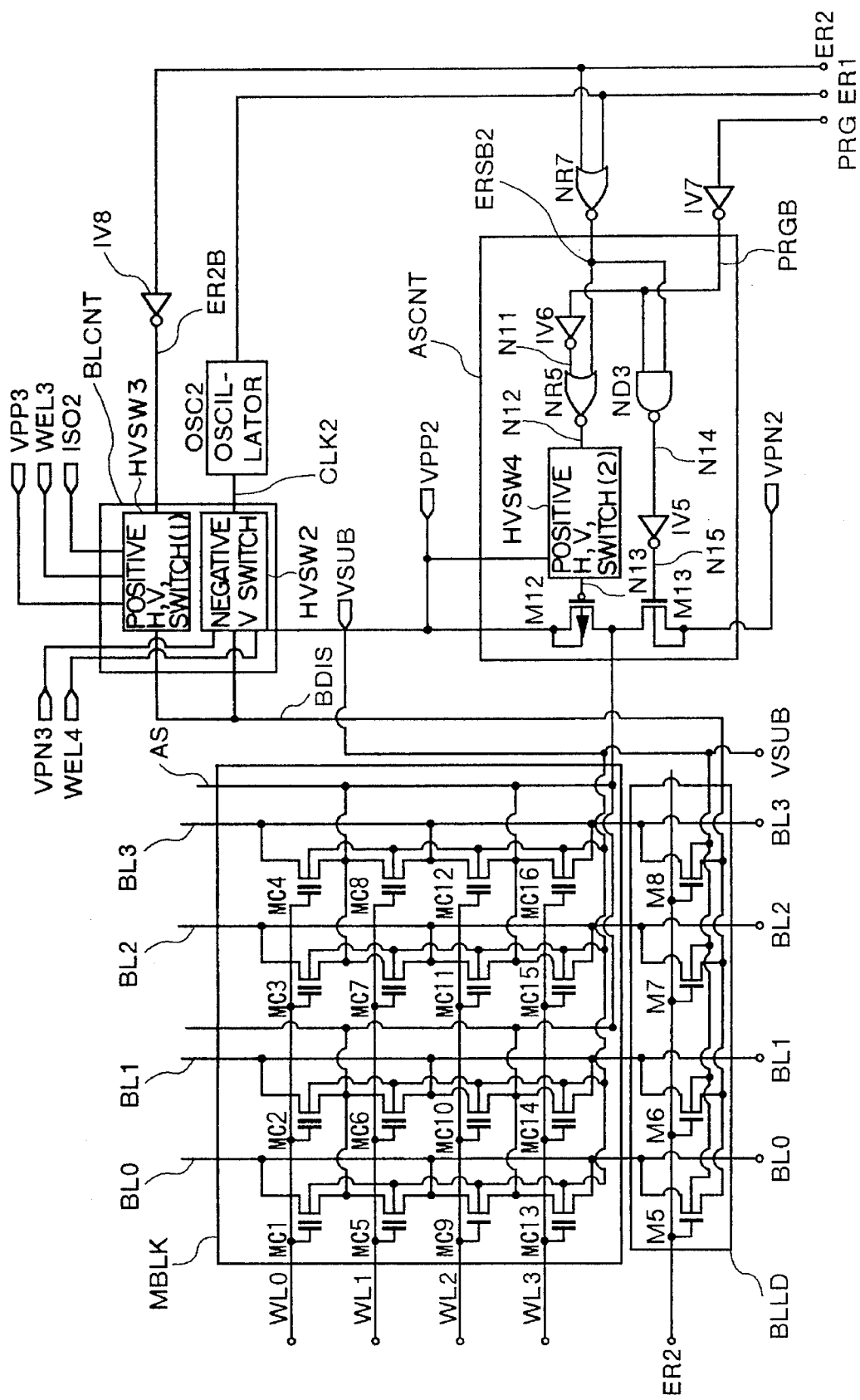
Figure 5:
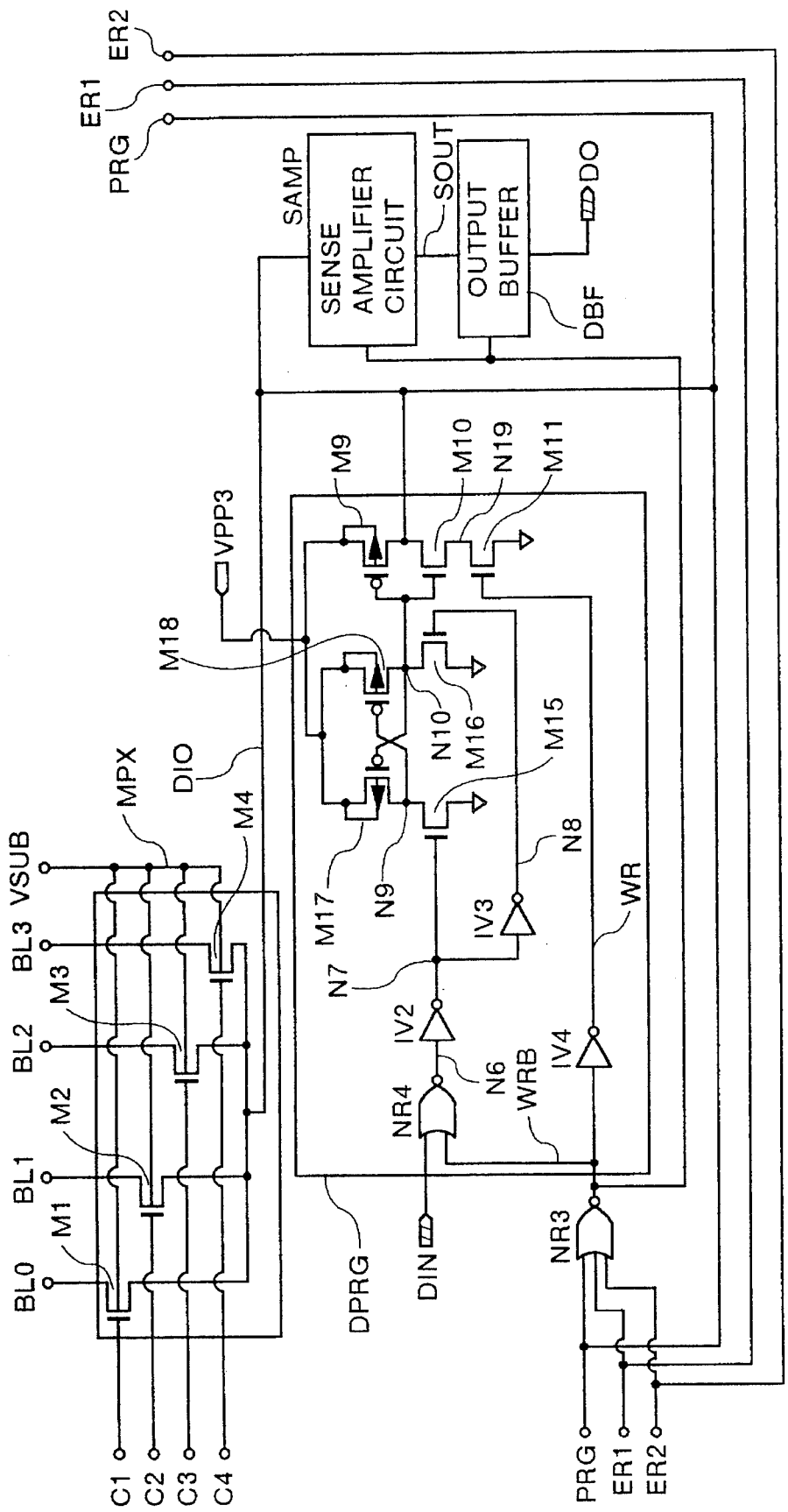
Figure 18:
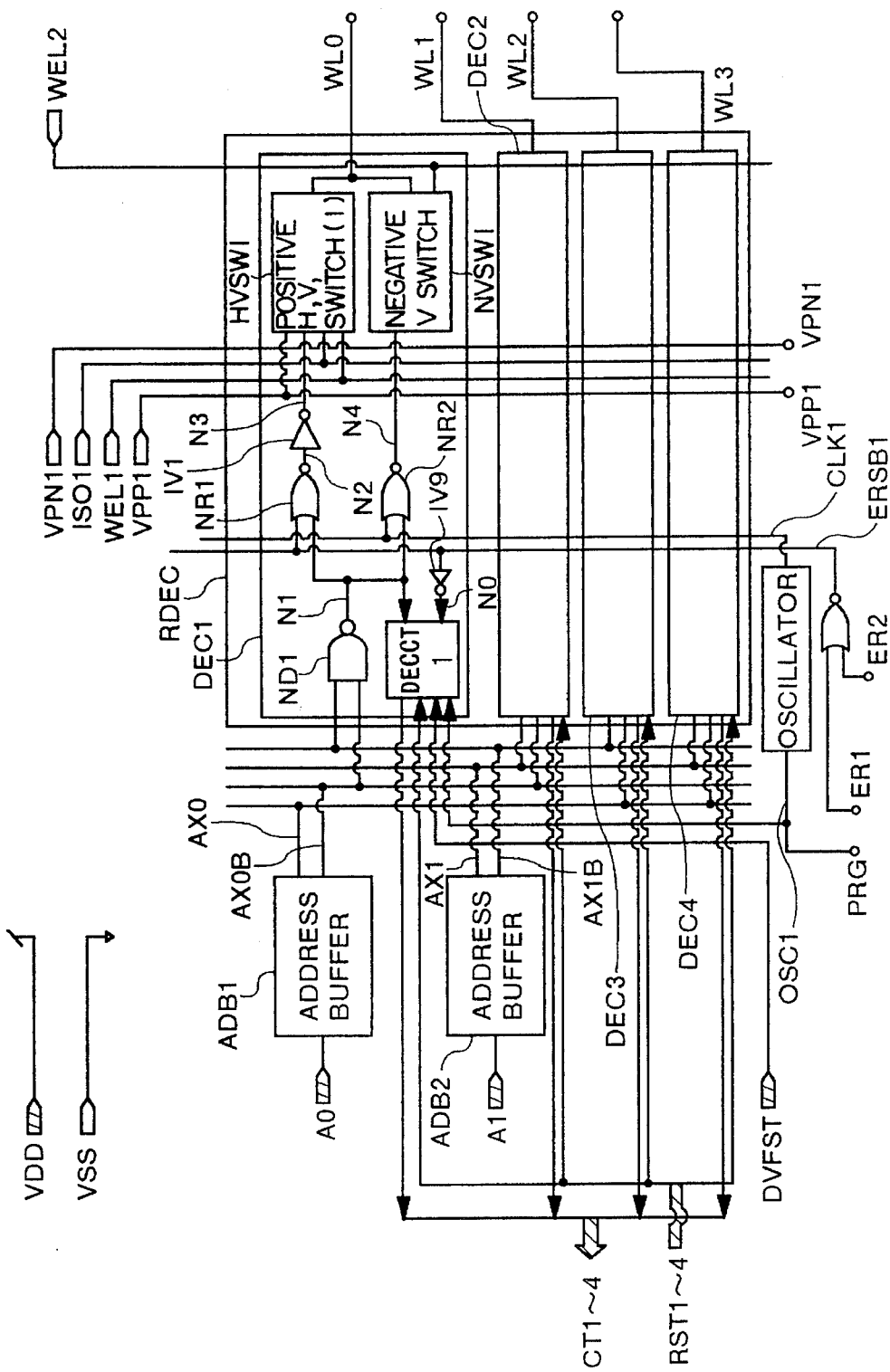
FIG. 18 is a detailed block diagram of one of the four divisions of the circuit arrangement of FIG. 17, corresponding to the circuit arrangement of FIG. 2.

The detailed constructions of the four parts into which the circuit arrangement of FIG. 17 is divided are the same as those shown in FIGS. 3, 4 and 5 other than the part shown in FIG. 18 corresponding to the circuit arrangement of FIG. 2. The construction of a different part of the circuit arrangement of FIG. 18 from that of FIG. 2 will be described with reference to FIG. 18.

The row decoder DEC1 includes the two-input NAND gate ND1 which receives the outputs AXOB and AX1B from the address buffers ADB1 and ADB2, the two two-input OR NOT gates (hereinafter, NOR gate) NR1 and NR2, the inverters IV1 and IV2, the positive high voltage switch circuit HVSW1, the negative voltage switch circuit NVSW1 and a counter circuit (hereinafter, "counter") DECCT1. The output N1 from the NAND gate ND1 is supplied to one input ends of the NOR gates NR1 and NR2 and the input of the DECCT1. The outputs ERSB1 and CLK1 are supplied to the other input ends of the NOR gates NR1 and NR2, respectively. The output N2 from the NOR gate NR1 is supplied to the input of the inverter IV1, the output N3 from the inverter IV1 to one input end of the positive high voltage switch HVSW1, and the output N4 from the NOR gage NR2 to one input of the negative voltage switch NVSW1. The output ERSB1 is supplied to the input of the inverter IV9. The inverter IV9 produces output N0.

The positive high voltage switch HVSW1 receives the output N3, high voltage signal VPP1, WEL1 and ISO1 and has its output connected to the row line (word line) WL0 of the memory block MBLK.

The negative voltage switch NVSW1 receives the output N4, WEL2 and negative voltage signal VPN1 and has its output connected to the same row line WL0 as the output of the positive high voltage switch HVSW1.

The counter DECCT1 counts the number of times that the word line WL0 is selected in writing or erasing. This counter receives the output N1 as data and the reset signal RST1, write signal PRG, output N0 and disturb verify mode start signal DVFST for control and produces output data CT1.

The row decoders DEC2, DEC3 and DEC4 are the same as the row decoder DEC1, but different in combinations of outputs from the address buffers ADB1 and ADB2 to the NAND gates and row lines to which their outputs are connected. The output of the decoder DEC2 is connected to the row line WL1, the output of the decoder DEC3 to the row line WL2 and the output of the decoder DEC4 to the row line WL3.

In this embodiment, writing, block erasing, bit erasing and reading are made as in the first embodiment by applying voltages shown in Table 1 to the selected word line, non-selected word lines, selected bit line, non-selected bit lines, memory source line and memory cell substrate.

At the time of writing and first and second erasing operations, or when at least one of the signals PRG, ER1 and ER2 is "H", the counter DECCT1 of row decoder DEC1 and the counters of row decoders DEC2 through 4 are activated. If the address signals A0 and A1 are "L", the output from the NAND gate ND1 of the row decoder DEC1 is "L" (at this time, selected state). At this time the content of the counter is increased by one and the data therefrom is latched. When the content of the counter reaches a certain number of times or more, the output CT1 of the counter DECCT1 is changed from "L" to "H".

In the disturb verify mode, the output of the counter connected to the word line selected by the address signal (here, the content of the address-up counter) is read out and supplied to the input of the write state control circuit WCNT in FIG. 1. If the address signal A0, A1 is "L", the output CT1 from the counter DECCT1 is supplied to the input of the write state control circuit WCNT. When the disturb verify mode ends, a signal for resetting the content of the counter connected to the word line selected by the content of the address-up counter becomes "H" and at the same time the content stored in the counter is reset. If the address signal A0, A1 is "L", the disturb verify action on the word line WL0 ends and then the reset signal RST1 becomes "H", thus the content of the counter DECCT1 being reset.

The circuits for disturb verify action and the operation thereof in this embodiment will be mentioned below.

Figure 19:
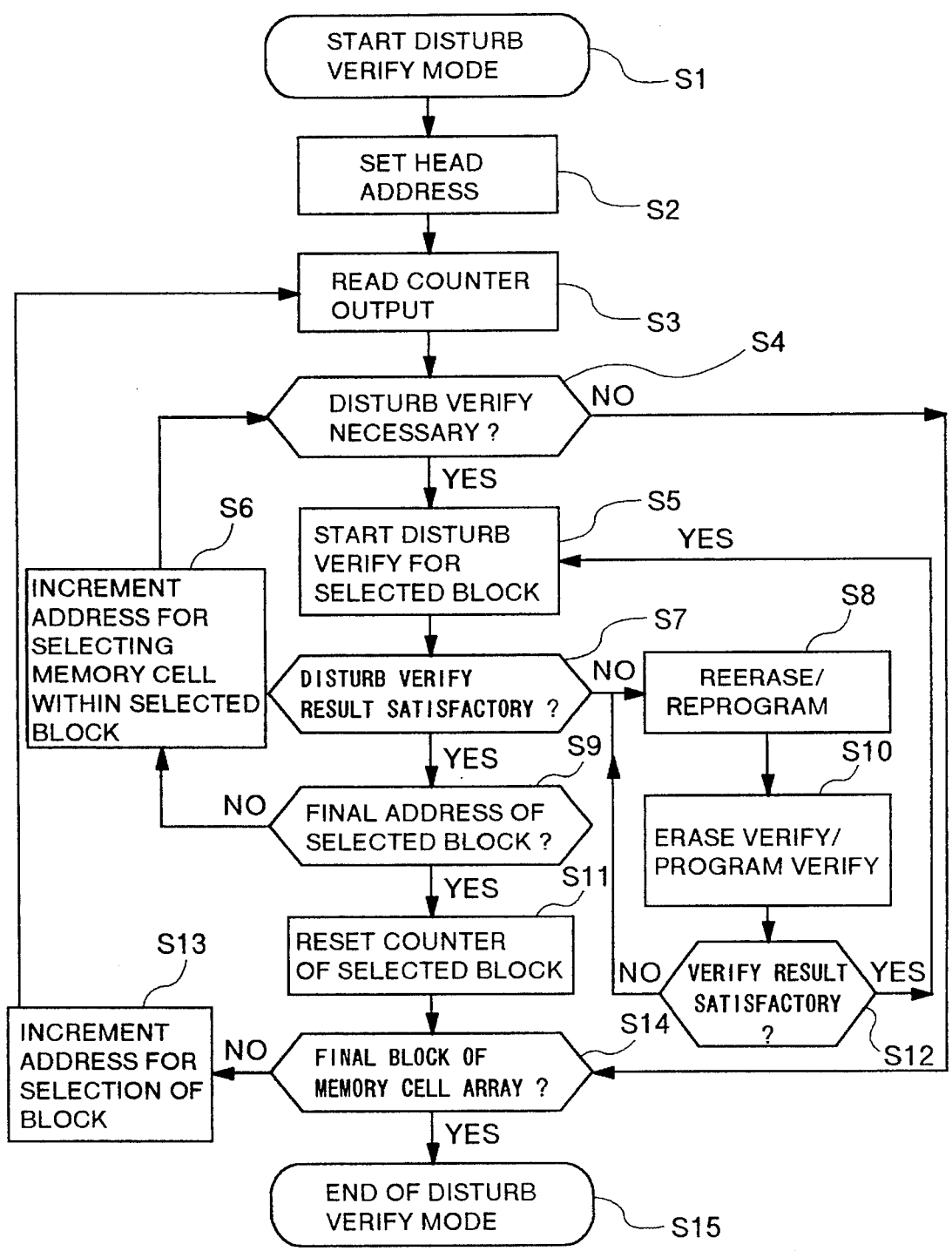
FIG. 19 is a flowchart for the disturb verify mode process in the third embodiment.

FIG. 19 is a flowchart for the disturb verify mode in this embodiment of the invention. Referring to the flowchart of FIG. 19, when a command signal and data are supplied from the external to the control terminal and data input terminal, the disturb verify mode is started (step S1). First the head address is decided (step S2) and the output of the counter connected to the first block (in this embodiment, the word line WL0) to be selected is read out(step S3). When the output is "L", or when the number of times of rewriting is less than a certain number of times (step S4), the disturbed memory cell is not verified (, or disturb verify action is not made) and the content of the address-up counter is increased by one (step S13). Then, the output of the counter connected to the next block is read out. If the output is "H", or if the number of times of rewriting is larger than a certain number of times (step S4), the memory cell within the selected block, or the disturbed memory cell is verified (step S5). This is the disturb address verify action.

If the result of verifying all disturbed addresses is satisfactory (step S7), the disturb verify action on the selected block ends (steps S9, S11, S14, S15). If the last address of memory cell within the selected block is not reached, the address for selecting a memory cell within the selected block is increased by one (step S6) and the memory cell within the selected block, or the disturbed memory cell is verified (step S5). If the result of the disturb verify action on a certain address is not satisfactory, switching is made to the erase or writing mode (step S8) in which the unsatisfactory memory cell is erased or written. Thereafter, the erase verify or write verify operation is made (step S10). If the result of the verify action is not satisfactory (step S12), the memory cell at the corresponding address is again erased or written. If the result of the erase verify or write verify action is satisfactory, the disturbed address verify action is continued (step S5). When the disturb verify action on the selected block is finished, the content of the counter for the selected block is reset (step S11) and the output of the counter connected to the next block is read out (step S3).

When the disturbed address verify action on all blocks is successfully performed after repetition of the above operations, the disturb verify mode finally ends.

Figure 20:
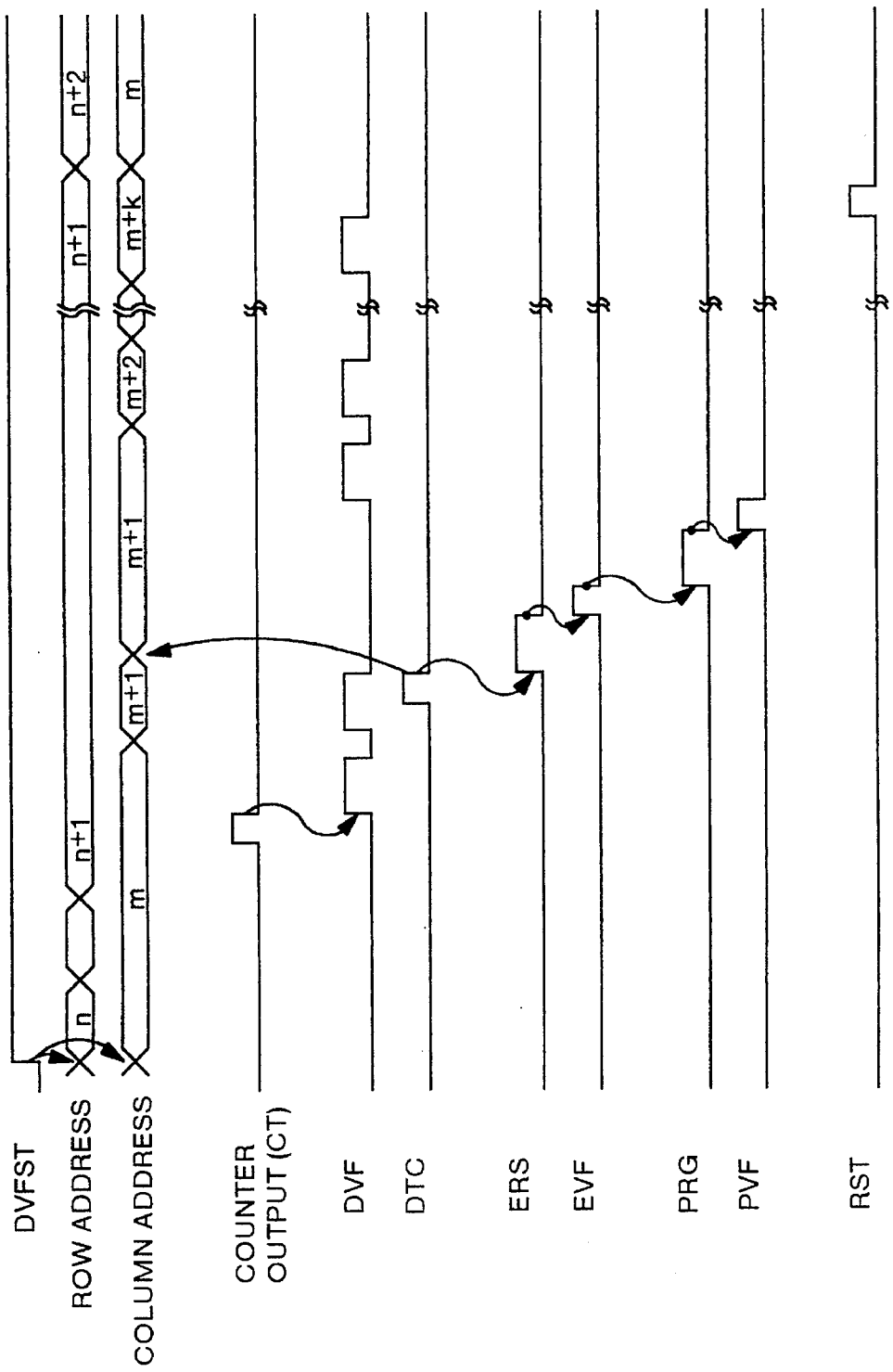
FIG. 20 is a timing chart of signals in the disturb verify mode process of the third embodiment.

FIGS. 20 is a timing chart of signals in the writing operation according to the flowchart of FIG. 19. The reference characters of the signals shown in FIG. 20 are the same as in FIG. 19.

When a command signal is supplied to the control input terminal and data input terminal, the disturb verify start signal DVFST as one of the outputs of the write state control circuit WCNT is changed from "L" to "H" and thus the disturb verify mode in this embodiment is started. At this time, the address-up counter AUPCT has the head address latched. If the memory cell being written is located at the first row (01h in hexadecimal notation), the first column (001h in hexadecimal notation) of the memory cell array of, for example, 4096 word lines and 4096 bit lines, a hexadecimal number of 01001h is set in the address-up counter. When the disturb verify mode is started, the content of the address-up counter AUPCT is loaded in the address buffer and the output of a counter connected to the block (in this embodiment, word line) selected by the address signal, for example, the output CT1 of the counter DECCT1 is supplied to the write state control circuit WCNT. When the count output CT1 is "L", the row address is incremented and for example the counter output CT2 within the decoder DEC2 is supplied to the write state control circuit WCNT. When the counter output CT2 is "H", the disturbed address of the block selected by the content of the address-up counter AUPCT is started to be verified.

Figure 21:
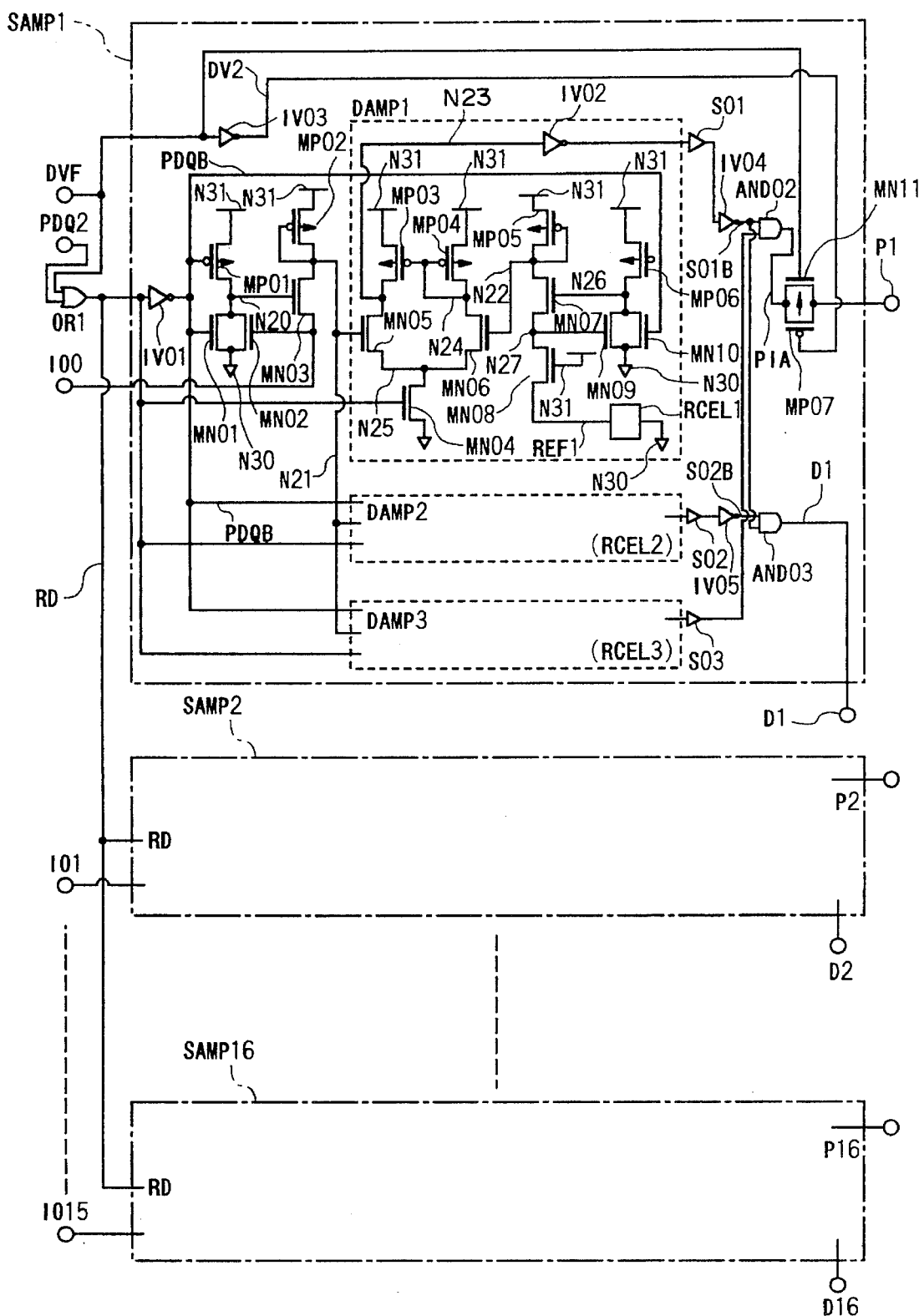
FIG. 21 is a detailed circuit block diagram of the sense amplifier in FIG. 17.
Figure 22:
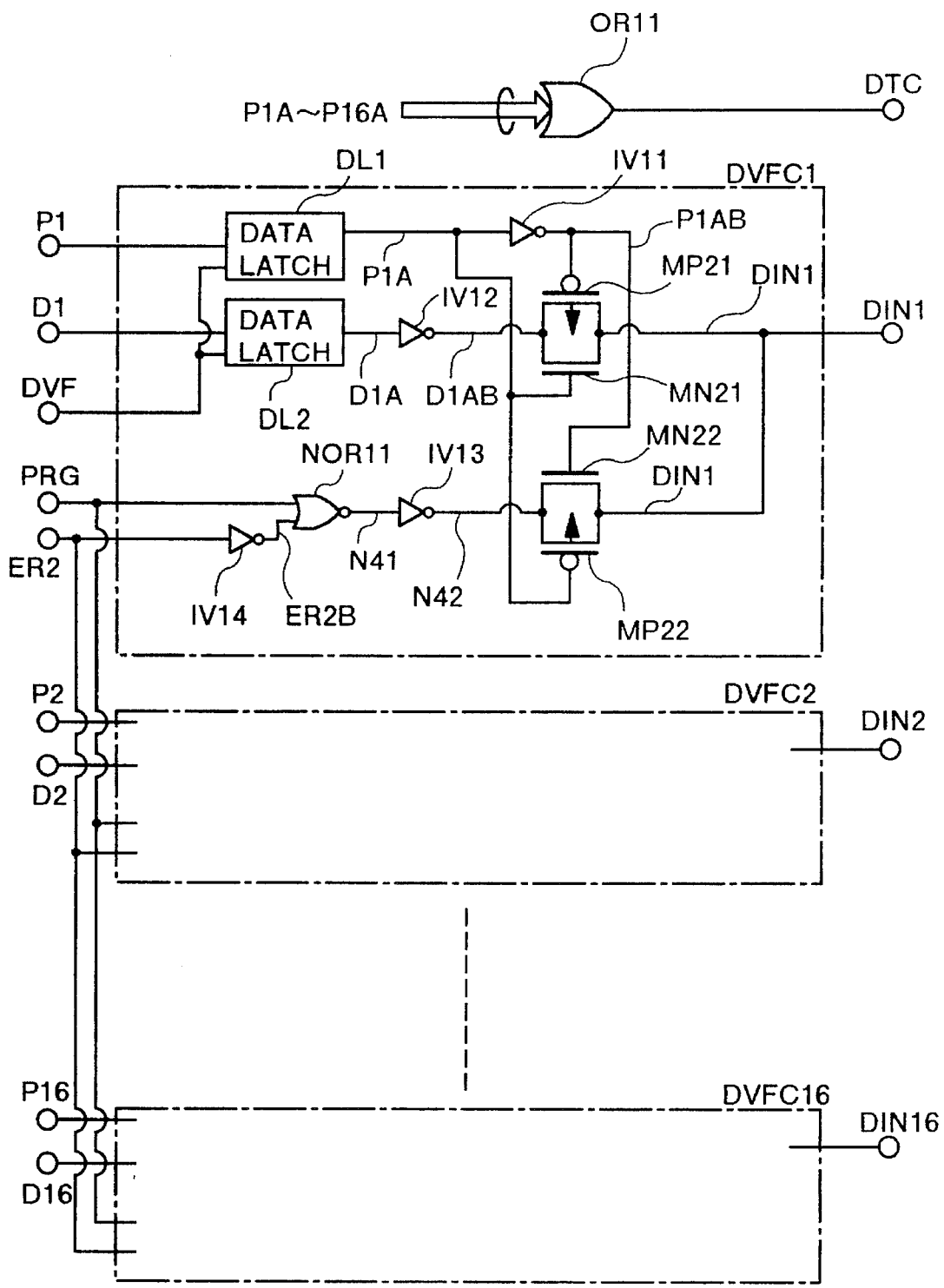
FIG. 22 is a detailed circuit block diagram of the disturbed data detection/correction circuit in FIG. 17.

FIG. 21 shows an example of the sense amplifier circuit (including write-in/erase disturb detecting means). FIG. 22 shows an example of the disturb data detection/correction circuit.

In FIGS. 20, 21 and 22, first when the output DVF becomes "H", the disturb detection voltage value (for example, the same as the applied voltage in the read mode) is applied to the control gate of the memory cell at the disturbed first address. At this time, it is assumed that the data at the address before being disturbed is, for example, DI01 through DIO16=(1111111100000000) in binary notation and that the threshold voltage of the memory cell is, for example, 1.5 V for DIO1 through DI08 and 7.5 V for DIO9 through DIO16. When the threshold voltage is not reduced or increased by disturbing and when the disturb detection voltage is applied, the output data D1 through D16 from the sense amplifier is (1111111100000000) and the disturb detecting data P1 through P16 is (0000000000000000). However, when the threshold voltage is reduced or increased by disturbing (for example, when the threshold voltage of the memory cell corresponding to DIO15 is reduced from 7.5 V to 6.5 V and the threshold voltage of the memory cell corresponding to DI02 is increased from 1.5 V to 2.5 V), the output data D1 through D16 from the sense amplifier is (1111111100000000) and the disturb detecting data P1 through P16 is, for example, (0100000000000010). Here, it is shown that when the disturb detecting data is equal to 1, the threshold voltage of the memory cell is changed by disturbing. Therefore, by viewing the sense amplifier output data D1 through D16 and disturb detecting data P1 through P16 it is possible to detect that the threshold has been changed by a constant value or above by disturbing and to know the original value.

In FIGS. 17, 20, 21 and 22, when the disturb detecting data P1 through P16 are all 0, or when the threshold voltage of the memory cell has been changed by a constant value or below by disturbing, the disturb verify data output signal DTC to the disturb data detection/correction circuit DVFC is, for example, still "L". If even one bit of the data P1 through P16 is "1", the disturb verify data output signal DTC is changed from, for example, "L" to "H". If the output signal DTC is "L", the address-up counter AUPCT responds to the output signal S3 from the timer TIM and is controlled by the control signal AUP to change the address so that a different memory can be selected from the same block. In other words, in this embodiment the row address remains fixed and the column address is increased by one. When the disturb verify action on a selected block is started, the timer TIM responds to the timer start signal S1 from the write state control circuit WCNT to start operating. When the output DTC is "H", the write state control circuit WCNT enters into the mode in which the memory cell at the disturbed address is reerased. In other words, the erase signal ERS is changed from, for example, "L" to "H".

In the embodiment shown in FIGS. 19 and 20, the above erase operation is performed bit by bit as in the first embodiment. By this erase operation it is possible to restore the threshold voltage of the disturbed memory cell from, for example, 6.5 V to 7.5 V. After the end of the erase operation, the write state control circuit WCNT performs the erase verify operation. If the result of the verify action is satisfactory, this time the rewriting (reprogramming) mode is brought about. That is, the erase signal ERS is "L" and the write signal PRG is "H". The threshold of the memory cell of which the threshold has been increased by disturbing is restored from, for example, 2.5 V to 1.5 V by the writing operation. After the end of the writing (programming) operation, the write state control circuit WCNT carries out the write verify (program verify) action. If the result of the verify action is satisfactory, the disturb verify operation is again executed.

After the above operations are repeated until the last address of the memory cells within the selected block, for example, a hexadecimal number of (01FFFh), the disturb verify action on the block selected by the row address ends. At this time, the content of the counter connected to the block selected by the above row address is reset by changing the reset signal RST from "L" to "H" and then the output of the counter for the next block is read. If the output is "H", the disturb verify action is made. When the disturb verify action on the final block, for example, in this embodiment, the block selected by the final address in the row direction ends after the above operations are repeated, the disturb verify mode ends.

FIG. 21 shows the details of the sense amplifier circuit in FIG. 17. PDQ2 or DVF is a signal for activating the sense amplifier circuit. D1 through D16 is output data and IO0 through IO15 is memory reading input data. PDQ2 is the inverted signal of the power-down signal shown in FIG. 19. IV01, IV02 through IV05 are inverter circuits which are formed of MOS transistors, AND02 and AND03 are two-input logic product circuits (AND gates) which are formed of MOS transistors and OR1 is a two-input logic sum circuit (OR gate) which is formed of MOS transistors. MP01, MP02 through MP07 are P-channel enhancement MOS transistors, MN01, MN02 through MN11 are N-channel enhancement MOS transistors and RCEL1, RCEL2 and RCEL3 are reference memory cells.

In FIG. 21, node N20 is connected to the drains of the transistors MP01, MN01 and MN02 and the gate of transistor MN03. N21 is connected to the drain and gate of transistors MP02, the drain of transistor MN03 and the gates of transistors MN05 of DAMP1, DAMP2 and DAMP3. N23 is connected to the drains of transistors MP03 and MN05 and the input of the inverter IV02. N22 is connected to the drain and gate of transistor MP05, the drain of transistor MN07 and the gate of transistor MN06. N24 is connected to the drains of transistors MP04 and MN06 and the gates of transistors MP03 and MP04. N25 is connected to the sources of transistors MN05 and MN06 and the drain of transistor MN04. N26 is connected to the drains of transistors MP06, MN09 and MN10 and the gate of transistor MN07. N27 is connected to the source of transistor MN07, the drain of transistor MN08 and the gate of transistor MN09. DAMP1 is a circuit block including transistors MP03, MP04, MP05, MP06, MN05, MN06, MN04, MN07, MN08, MN09 and MN10, an inverter IV02 and a reference memory cell RCEL1. DAMP2 and DAMP3 are circuit blocks including the same transistors and so on as in DAMP1.

In FIG. 21, PDQ2 and DVF are input signals to the OR gate OR1. DVF is also an input signal to the inverter IV03 and connected to the gate of transistor MN11. RD is the output of the OR gate OR1 and connected to the input of the inverter IV01 and the gates of transistors MN04 of DAMP1, DAMP2 and DAMP3. The output PDQB of the inverter IV01 is connected to the gates of transistors MP01 and MN01 and the gates of transistors MP06 and MN10 of DAMP1, DAMP2 and DAMP3. IO0 is connected to the gate of transistor MN02 and the source of transistor MN03. DV2 is the output of the inverter IV03 and connected to the gate of transistor MP07. P1 is connected to the drains of transistors MN11 and MP07.

SO1 is the output of the inverter IV02 of DAMP1 and the input to the inverter IV04. SO2 corresponds to the output from the inverter IV02 of DAMP2 and is the input to the inverter IV05. SO3 corresponds to the output from the inverter IV02 of DAMP3 and is the input to the AND gate AND02. SO1B is the output from the inverter IV04 and the input to the AND gates AND02 and AND03. SO2B is the output from the inverter IV05 and the input to the AND gate AND03. D1 is the output from the AND gate AND03. P1 is the output from the AND gate AND02 and connected to the sources of transistors MN11 and MP07. REF1 is connected to the source of transistor MN08 of DAMP1 and the drain of the reference cell RCEL1. REF2 and REF3 are connected to the sources of transistors MN08 and the drains of reference cells RCEL2 and RCEL3 of DAMP2 and DAMP3 respectively. N30 is grounded node and connected to the grounded nodes of the inverter circuits and AND gates and OR gates, the source terminals of transistors MN01, MN02, MN04, MN09 and MN10 and the sources of the reference cells RCEL1, RCEL2 and RCEL3. N31 is the power supply node and connected to the power supply nodes of the inverter circuits, AND gates and OR gates, the sources of transistors MP01, MP02, MP03, MP04, MP05 and MP06 and the gate of transistor MN08.

SAMP1 is a circuit block formed of transistors MP01, MP02, MP07, MN01, MN02, MN03 and MN11, DAMP1, DAMP2, DAMP3, inverters IV01, IV03, IV04 and IV05 and AND gates AND02 and AND03. SAMP2 through SAMP16 have the same construction as SAMP1 and outputs D1 through D16 and P1 through P16 respectively.

In FIG. 21, when PDQ2 or DVF is "H", RD becomes "H" and I00 is at the same potential as the column line of the selected memory cell. Since PDQB is a low voltage, the transistor MP01 is turned on and transistor MN01 is turned off with the result that the voltage of N20 is increased from 0 V. When the voltage of N20 is raised, the transistor MN03 is turned on and I00 is the remainder of subtraction of the threshold voltage of MN03 from N20. However, when the voltage of I00 becomes higher than the threshold of the MN02, the transistor MN02 is turned on and the potential of I00 is suppressed from increasing. Therefore, when RD is "H", the voltage of I00 becomes an intermediate value between 0 V and the power supply voltage, for example, 2 V. At this time, when the memory cell being read is in the on-state, current flows from I00 to the source of the memory cell, resulting in slight reduction of I00 potential (for example, 1.8 V). Since the current supply for this is made through the transistor MP02, the voltage of N21 is greatly reduced as compared to that of I00 (for example, from 4.2 V to 3.5 V) if the size of the transistor MP02 is properly selected.

In addition, since the voltage of N21 is naturally proportional to the amount of current flowing in the memory cell, the transistors MP01, MN02, MN03 and MP02 amplify the potential variation of I00. The transistors MP03, MP04, MN05, MN06 and MN04 constitute a differential amplifier, and N21 and N22 are the differential input to the amplifier. The circuit formed of transistors MP05, MP006, MN07, MN09 and MN10 is analogous to that of transistors MP02, MP01, MN03, MN02 and MN01 and has the same action on REF1 as I00. The transistor MN08 serves to transmit the potential of REF1 to N27. I01 through I015 in SAMP2 through SAMP16 are respectively the nodes corresponding to I00.

The relation of the threshold of the memory cell being read to the threshold voltages of reference cells RCEL1 through RCEL3 is the same as in the first embodiment shown in FIG. 13.

FIG. 22 shows the details of the disturb data detection/correction circuit.

DVF, PRG and ER2 are input control signals, P1 through P16 and D1 through D16 are input data signals and DTC is an output control signal. DIN1 through DIN16 are output data signals. DIN1 through DIN16 in FIG. 22 correspond to DATIN in FIG. 1 or DIN in FIG. 5. ER2 corresponds to ERS in FIG. 19 or ER2 in FIG. 18.

In FIG. 22, OR1 is an OR gate formed of MOS transistors, IV11 through IV14 are inverter circuits formed of MOS transistors and NOR11 is an OR NOT circuit (NOR gate) formed of MOS transistors. MP21 and MP22 are enhancement P-channel MOS transistors and MN21 and MN22 are enhancement N-channel MOS transistors.

In FIG. 22, P1 is input data to a data latch DL1, D1 is input data to a data latch DL2 and DVF is the input control signal to the data latches DL1 and DL2. PRG is the input signal to the NOR gate NOR11 and ER2 is the input signal to the inverter IV14. ER2B is the output from the inverter IV14 and the input to the NOR gate NOR 11. N41 is the output from the NOR gate NOR11 and the input to the inverter IV13. N42 is the output from the inverter IV13 and connected to the drains of the transistors MN22 and MP22.

P1A is the output from the data latch DL1, the input to the inverter IV11 and connected to the gates of the transistors MN21 and MP22. P1AB is the output from the inverter IV11 and connected to the gates of the transistors MP21 and MN22. D1A is the output from the data latch DL2 and the input to the inverter IV12. D1AB is the output from the inverter IV12 and connected to the drains of the transistors MN21 and MP21. DIN1 is an output node and connected to the sources of the transistors MN22, MP22, MN21 and MP21.

DVFC1 is a circuit block which includes the data latches DL1 and DL2, the inverters IV11, IV12, IV13 and IV14, the NOR gate NOR11 and the MOS transistors MP21, MP22, MN21 and MN22. The input signals thereto are DVF, PRG, ER2, P1 and D1 and the output signal therefrom is DIN1. DVFC2 through DVFC16 are circuit blocks which have the same construction as DVFC1. The input signals thereto are DVF, PRG, ER2, P2 through P16 and D2 through D16 and the output therefrom are DIN2 through DIN16.

P1A through P16A are respectively nodes in DVFC1 through DVFC16, corresponding to P1A. P1A through P16A are the input to the OR gate OR1 and DTC is the output from the OR gate OR1.

The operation of the disturbed data detection/correction circuit will be described with reference to FIG. 22.

When DVF="H" in the circuit blocks DVFC1 through DVFC16, the data latches DL1 and DL2 of DVFC1 and the data latches DL1 and DL2 of DVFC2 through DVFC16 become active and the data of P1 through P16 and D1 through D16 are supplied to the data latches DL1 and DL2 of DVFC1 and to the data latches DL1 and DL2 of DVFC2 through DVFC16. The same signals as P1 through P16 and D1 through D16 are produced on P1A through P16A and D1A through D16A. Here, P1 through P16 and D1 through D16 are the outputs from the sense amplifier circuits of FIG. 11. When DVF="L", the data at DVF="H" are stored in the data latches. If even one of P1A through P16A to the OR gate OR1 is "H", the OR gate OR1 supplies the signal of DTC="H" to the write state control circuit WCNT. If P1A through P16A are all "L", the signal of DTC="L" is supplied to the write state control circuit WCNT.

If D1=Pi="L" in DVFC1, or when the threshold voltage of the selected memory cell is higher than that of the reference cell RCEL1 in FIG. 13, P1A and D1A equal to "L" and P1AB and D1AB equal to "H". At this time, since the transistors MP21 and MN21 are turned off, the potential at D1AB is not transmitted to DIN1. On the other hand, it will be seen from FIG. 20 that when DVF="H", PRG=ER2="L". Thus, ER2B is "H", N41 is "L", N42 is "H", and transistors MN22 and MP22 are turned on. Accordingly, the potential at N42 is transmitted to DIN1 and DIN1 is "H". If D2 and P2 in DVFC2 are "L" and "H" respectively, or in FIG. 13 when the threshold voltage of the selected memory cell is an intermediate value between the threshold voltages of reference cells RCEL1 and RCEL2, P2A is "H", D2A is "L", P2AB is "L" and D2AB is "H". At this time, the transistors MP21 and MN21 are turned on and transistors MP22 and MN22 are turned off. Thus, the potential at D1AB is transmitted to DIN2 and DIN2 is "H". Here, P2A, D2A, P1AB and D1AB correspond to P1A, D1A, P1AB and D1AB in DVFC1.

At this time, the input DIN to the data rewrite circuit DPRG in FIG. 5 is "H". However, while the disturbed data is being detected, or when DVF="H", PRG, ER1 and ER2 are "L". Thus, the data rewrite circuit DPRG is not active and the internal data line DIO in FIG. 5 (or node IO in FIG. 1) is at a floating state.

When DTC is "H", the bit erase mode is brought about for making the reerasing operation continuously. Thus, DVF, ER2 and PRG become "L", "H" and "L" respectively, thereby activating the data rewrite circuit DPRG. In DVFC1, DIN1 becomes "L" for turning N42 "L". In DVFC2, data of D2 is inverted and produced on DIN2, thus DIN2 becoming "H". Since the inverted data of DIN1, DIN2 through DIN16 are produced on the internal data line (corresponding to IO in FIG. 17 and DIO in FIG. 5), for example the internal data line potential IO corresponding to DIN1 is "H" and the internal data line potential IO corresponding to DIN2 is "L".

Since in the bit erase mode the selected bit line potential and non-selected bit line potential are "L"(=0 V) and "H"(=5 V) respectively, the memory cell of read data DI=PI="L" is not erased for bit, but the memory cell of D2="L" and P2="H" is erased for bit. Therefore, only the threshold voltage of the memory cell of which the threshold voltage has been reduced by disturbing can be restored to a high value.

On the other hand, when rewriting (reprogramming) is made, or when PRG and ER2 are "H" and "L" respectively, the selected bit line potential (=0 V) in writing is applied from the internal data line IO to only the memory cell of which both read data Dn and Pn are "H" (n=1, 2 through 6), and such signals as to supply a voltage of 5 V to the other internal data lines are produced from DIN1 through DIN16. Thus only the threshold voltage of the memory cell of which the threshold voltage has been increased by disturbing can be restored to a low value.

By the above operations it is possible to write or erase only the memory cell which is necessary to restore the threshold voltage in the rewriting or reerasing mode in which the nonvolatile semiconductor memory device for making parallel writing and erasing of a plurality of bits performs disturb verify operation.

Figure 23:
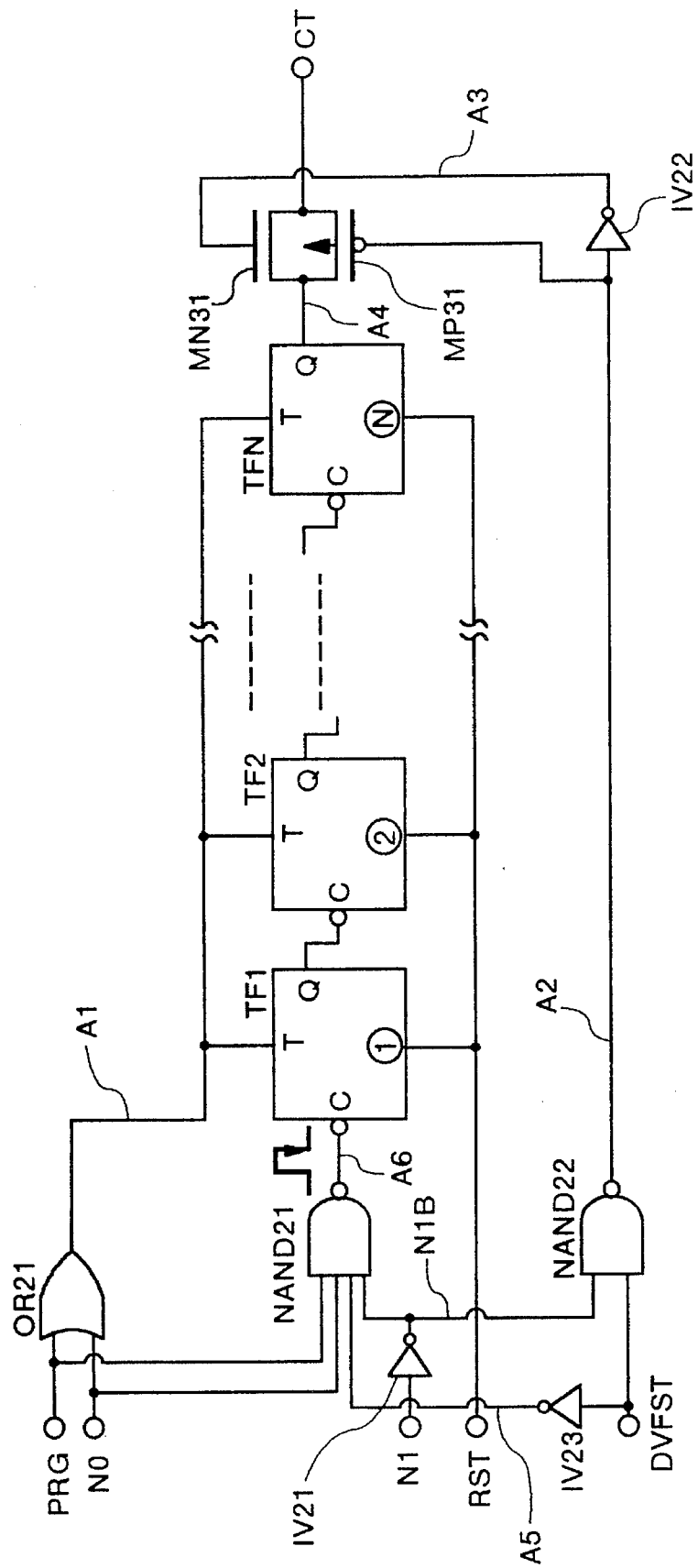
FIG. 23 is a detailed circuit block diagram of the counting circuit in the third embodiment.

FIG. 23 is a detailed circuit block diagram of the counter circuit of this embodiment.

In FIG. 23, the input and output signals are the same as in FIGS. 2 through 5. In FIG. 23, OR21 is a logic sum circuit (OR gate) formed of MOS transistors, NAND21 and NAND22 are AND NOT circuits (NAND gates) formed of MOS transistors, IV21, IV22 and IV23 are inverter circuits formed of MOS transistors, MP31 is an enhancement P-channel MOS transistor and MN31 is an enhancement N-channel MOS transistor. TF1 and TF2 through TFN are toggle flip-flops.

In FIG. 23, the input signals to the OR circuit OR21 are PRG and N0 and the output therefrom is A1. The input signals to the NAND gate NAND21 are PRG, N0, A5 and N1B and the output therefrom is A6. The input signals to the NAND gate NAND22 are N1B and DVFST and the output therefrom is A2. The input signal to the inverter IV21 is N1 and the output therefrom is N1B. The input to the inverter IV22 is A2 and the output therefrom is A3. The input signal to the inverter IV23 is DVFST and the output therefrom is A5. The transistor MP31 has its gate terminal connected to A2, its source terminal connected to CT and its drain terminal connected to A4. The transistor MN31 has its gate terminal connected to A3, its source terminal connected to CT and its drain terminal connected to A4. The input signals to the toggle flip-flops TF1, TF2 through TFN are T, C and RST and the output signals therefrom are Q. The input T to the TF1, TF2 through TFN is connected to A1. The input C to TF1 is connected to A6 and the output Q from TF1 to the input C to TF2. The output Q from TF2 is connected to the input C to the following toggle flip-flop. The input C to TFN is connected to the output Q from the preceding toggle flip-flop and the output Q from TFN to A4.

In FIG. 23, when PRG or N0 and DVFST are "H" and "L" respectively, the counter circuit is activated. Each time N1 is changed from "H" to "L", A6 is changed from "H" to "L" and the counter is changed one up. When DVFST and N1 become "H" and "L" respectively, the counter circuit is made in the mode in which the count information is read out on the counter output CT. When RST becomes "H", the toggle flip-flops TF1, TF2 through TFN of the counter circuit are reset.

As described above, the nonvolatile semiconductor memory device of this invention successfully operates. The disturb detection/correction circuit and means of the embodiment of this invention is able to correct both the decrease and increase of the threshold of the memory cell due to disturbing action. In addition, since the sense amplifier circuits of this embodiment of the invention can produce both the stored information of memory cells (D1 through D16 in FIG. 21) and the disturbance detecting data (P1 through P16 in FIG. 21), the stored information of memory cells and disturbance detecting data can be simultaneously supplied to the disturb verify data detection/correction circuit in FIG. 1. According to the main points of this invention, the connection and construction of the memory cells are not always necessary to be the same as in this embodiment, but may have for example a plurality of memory source lines decoded by such signals as column decode outputs. In addition, while in this embodiment a kind of writing system and two kinds of erasing system are proposed, it is particularly not necessary to specify a writing system and an erasing system in this embodiment.

Moreover, while this embodiment employs the writing or erasing means for restoring the memory cell of which the threshold voltage has been changed by disturbing, the voltage value applied to that memory cell is not always necessary to be the same as in the actual writing operation or erasing operation. This is because the threshold of the memory cell is changed from, for example, 2 V to 7.5 V in the actual erasing operation but may be changed from, for example, 6.5 V to 7.5 V in order to restore the threshold of the disturbed memory cell, that is, the voltage variation may be lower than in the actual erasing operation and also for the same reason the writing voltage may be lower than in the actual writing operation. In addition, the shape of the memory cells may be arbitrary. Also, another function may be added to this embodiment as long as the disturbance detection/correction circuit and means are provided.

The voltage values used in this embodiment may be changed within an allowable range of design. In addition, while in this embodiment the counter is connected to each word line, one counter may be provided to each several word lines. Also, the counter may be connected to the bit line or source line.

The counter circuits of this embodiment are not necessary to have the same construction as in FIG. 23, but may be counters which can count the number of times each block of the memory cell array is selected.

In the electrically writable or alterable nonvolatile semiconductor memory device, since the disturbed memory cell can be detected and restored by the electrical circuit and means before the data is destroyed by disturbance, the resistance to disturbance can be greatly improved. In the method of detecting the disturbed memory cell according to this invention, threshold voltage detection levels are provided of which the number is at least twice or three times or above as large as the minimum number necessary for reading the stored information of the memory cell, and the threshold voltage of the memory cell is compared to those detection levels so that the stored information of the memory cell and the disturbance detecting data can be simultaneously known. Therefore, this invention has the effect that the disturbing action can be detected by the same operation as at the time of reading in the nonvolatile semiconductor memory device.

Since the counter circuits and means are provided for counting the number of times that the memory cells of each of a plurality of blocks of memory cells are selected upon writing or erasing, the disturbed memory cells within a block which are found to have been selected a certain number of times or above upon writing or erasing from the count information from the counter circuits and means can be detected and corrected, and thus the time in which the disturbance detection/correction is made can be shortened.

The final resistance-to-disturbance time is represented by the resistance-to-disturbance time in the conventional circuit multiplied by the number of times of possible restoration. The number of times of possible restoration is equal to or larger than the number of times of operations for rewriting of the memory cell. Thus, if the resistance-to-disturbance time in the conventional circuit is one second and the number of times of operations for rewriting of the memory cell is a hundred thousand, the resistance-to-disturbance time is a hundred thousand seconds. Therefore, it will be found that there is enough time for sector erasing. Thus, according to this invention, it is not necessary to optimize the structure of memory cells and devise the manufacturing method as in the prior art and it is possible to greatly increase the resistance to disturbance, leading to more improvement of the reliability in holding data in the nonvolatile semiconductor memory device of the invention. In addition, the document 3 describes that if the ability to write or erase a memory cell or memory cells under a low power supply voltage is realized in the manufacturing processes, the resistance-to-disturbance time will be normally shortened, while the present invention can extend the resistance-to-disturbance time and thus guarantee the operation under a low power supply voltage.

What is claimed is:

1. An electrically writable nonvolatile semiconductor memory device comprising:

a plurality of electrically writable nonvolatile semiconductor memory cells arranged in rows and columns;

a decoder circuit for making at least one of said memory cells in a selected state and the other ones in a non-selected state;

writing means for writing said memory cell in the selected state through said decoder circuit;

reading means for reading said memory cell in the selected state through said decoder circuit;

detecting means for detecting a change of the threshold voltage of each of said non-selected memory cells, which change is caused by a voltage applied to the non-selected memory cell when writing said selected memory cell; and restoring means for restoring the threshold voltage of the non-selected memory cell to a value equal to or near to its original value of the threshold voltage of the non-selected memory cell before its change on the basis of a result of detecting the change of the threshold voltage of the non-selected memory cell.

2. A semiconductor memory device according to claim 1, wherein said detecting means provides a number of detection levels for detecting the threshold voltage of the selected memory cell more than a minimum number of the detection levels necessary for reading information stored in the selected memory cell and compares said detection levels with the threshold voltage of each of the memory cells thereby to obtain information for detecting the change of the threshold voltage in addition to the information stored in the selected memory cell.

3. A semiconductor memory device according to claim 1, further comprising a control circuit for causing said detecting means to operate, when a writing mode is specified by an external signal or command, after writing into said selected memory and causing said restoring means to operate based on a result of detection of the change of the threshold voltage of the non-selected memory cell.

4. An electrically writable and erasable nonvolatile semiconductor memory device comprising:

a plurality of electrically writable and erasable nonvolatile semiconductor memory cells arranged in rows and columns;

a decoder circuit for making at least one of said memory cells in a selected state and the other ones in a non-selected state;

writing means for writing said memory cell in the selected state through said decoder circuit;

erasing means for erasing said memory cell in the selected state through said decoder circuit;

reading means for reading said memory cell in the selected state through said decoder circuit;

detecting means for detecting a change of a threshold voltage of each of said non-selected memory cells, which change is caused by a voltage applied to the non-selected memory cell when writing or erasing said selected memory cell; and restoring means for restoring the threshold voltage of the non-selected memory cell to a value equal to or near to its original value before its change on the basis of a result of detecting the change of the threshold voltage of the non-selected memory cell, wherein said detecting means provides a number of detection levels for detecting the threshold voltage of the non-selected memory cell more than a minimum number of the detection levels necessary for reading information stored in the memory cell and compares the detection levels with the threshold voltage of each memory cell thereby to derive information on the change of the threshold voltage in addition to information stored in the memory cell.

5. A semiconductor memory device according to claim 4, further comprising a control circuit for causing said detecting means to operate, when a writing mode or an erasing mode is specified by an external signal or command, after writing or erasing said selected memory cell and causing said restoring means to operate based on a result of detecting the change of the threshold voltage of the non-selected memory cell.

6. An electrically writable and erasable nonvolatile semiconductor memory device comprising:

a plurality of electrically writable nonvolatile semiconductor memory cells arranged in rows and columns;

a decoder circuit for making at least one of said memory cells in a selected state and the other ones in a non-selected state;

writing means for writing said memory cell in the selected state through said decoder circuit;

erasing means for erasing said memory cell in the selected state through said decoder circuit;

reading means for reading said memory cell in the selected state through said decoder circuit;

first detecting means for detecting a change of a threshold voltage of each of the non-selected memory cells, which change is caused by a voltage applied to the non-selected memory cell when writing said selected memory cell;

second detecting means for detecting a change of the threshold voltage of each of the non-selected memory cells, which change is caused by a voltage applied to the non-selected memory cell when erasing said selected memory cell; and restoring means for restoring the threshold voltage of the non-selected memory cell to a value equal to or near to its original value before its change on the basis of a result of detecting the change of the threshold voltage of the non-selected memory cell by said first or second detecting means, wherein each of said first and second detecting means provides a number of detection levels for detecting the threshold voltage of the selected memory cell more than a minimum number of the detection levels necessary for reading information stored in said selected memory cell and compares said detection levels with the threshold voltage of the selected memory cell thereby to obtain information for detecting the change of the threshold voltage in addition to information stored in the memory cell.

7. A semiconductor memory device according to claim 6, wherein each of said first and second detecting means provides a plurality of threshold voltage detection levels, of which a number is at least twice a minimum number necessary for reading information stored in said memory cell when obtaining information as to whether the threshold voltage of the non-selected memory cell has changed or not from its original value at the time of writing or erasing and provides a plurality of threshold voltage detection levels, of which a number is at least three times a minimum number necessary for reading information stored in the memory cell when obtaining information as to whether the threshold voltage of the nonselected memory cell has changed up or down from its original value at the time of writing or erasing, and compares said detection levels with the threshold voltage of the non-selected memory cell to obtain information for detecting the change of the threshold voltage of said non-selected memory cell in addition to information stored in the selected memory cell.

8. An electrically writable nonvolatile semiconductor memory device comprising:

a plurality of electrically writable nonvolatile semiconductor memory cells arranged in rows and columns:

a decoder circuit for making at least one of said memory cells in a selected state and the other ones in a non-selected state;

writing means for writing said memory cell in the selected state through said decoder;

reading means for reading said memory cell in the selected state through said decoder circuit;

detecting means for detecting a change of a threshold voltage of each of the non-selected memory cells, which change is caused by a voltage applied to the non-selected memory cell when writing said selected memory cell;

restoring means for restoring the threshold voltage of the non-selected memory cell to a value equal to or near to its original value before its change on the basis of a result of detecting the change of the threshold voltage of the non-selected memory cell; and counting means provided for each block including one or a plurality of the memory cells for counting a number of times of selection by which the block is selected for writing, wherein only when the number of times of selection exceeds a predetermined value, said change of the threshold voltage of the memory cell in said block is detected and the threshold voltage is restored.

9. An electrically writable and erasable nonvolatile semiconductor memory device comprising:

a plurality of electrically writable and erasable nonvolatile semiconductor memory cells arranged in rows and columns;

a decoder circuit for making at least one of said memory cells in a selected state and the other ones in a non-selected state;

writing means for writing said memory cell in the selected state through said decoder circuit;

erasing means for erasing said memory cell in the selected state through said decoder circuit;

reading means for reading said memory cell in the selected state through said decoder circuit;

detecting means for detecting a change of a threshold voltage of each of the non-selected memory cells, which change is caused by a voltage applied to the non-selected memory cell when erasing said selected memory cell;

restoring means for restoring the threshold voltage of the non-selected memory cell to a value equal to or near to its original value before its change on the basis of a result of detecting the threshold voltage of the non-selected memory cell; and counting means provided for each block including one or a plurality of said memory cells for counting a number of times of selection by which the block is selected for writing or erasing, wherein only when said number of times of selection exceeds a predetermined value, the change of the threshold voltage of the memory cell in said block is detected and the threshold voltage is restored.

10. A semiconductor memory device according to claim 8, further comprising a control circuit for reading count information from said counting means when a mode for detecting the change of the threshold voltage of the non-selected memory cell and restoring the threshold voltage is selected by an external signal or external command, and for activating said detecting means when the number of times of selection exceeds the predetermined value, and when the change of the threshold voltage of the non-selected memory cell is detected, activating said restoring means.

11. A semiconductor memory device according to claim 8, wherein said detecting means provides a number of detection levels more than a minimum number thereof necessary for reading information stored in the memory cell and compares said detection levels with the threshold voltage of the memory cell to derive information stored in said memory cell and information on the change of the threshold voltage.

12. A semiconductor memory device according to claim 8, wherein said detecting means provides a plurality of threshold voltage detection levels, of which a number is at least twice a minimum number necessary for reading information stored in said memory cell when obtaining information as to whether the threshold voltage of the non-selected memory cell has changed or not by comparing its original value with the detection levels at the time of writing or erasing or a plurality of threshold voltage detection levels, of which a number is at least three times a minimum number necessary for reading information stored in said memory cell when obtaining information as to whether the threshold voltage of the non-selected memory cell has changed up or down by comparing its original value with the detection levels at the time of writing or erasing, and compares said detection levels with the threshold voltage of the non-selected memory cell to obtain information stored in said selected memory cell and information on said change of the threshold voltage of the non-selected memory cell.

13. An electrically writable and erasable nonvolatile semiconductor memory device comprising:

a plurality of electrically writable nonvolatile semiconductor memory cells arranged in rows and columns;

a decoder circuit for making at least one of said memory cells in a selected state and the other ones in a non-selected state;

writing means for writing said memory cell in the selected state through said decoder circuit;

erasing means for erasing said memory cell in the selected state through said decoder circuit;

reading means for reading said memory cell in the selected state through said decoder circuit;

first detecting means for detecting a change of the threshold voltage of the non-selected memory cell, which change is caused by a voltage applied to the non-selected memory cell when writing said selected memory cell;

second detecting means for detecting the change of the threshold voltage of said non-selected memory cell which change is caused by a voltage applied to said non-selected memory cell, when erasing said selected memory cell;

restoring means for restoring the threshold voltage of the non-selected memory cell to a value equal to or near to its original value before its change on the basis of a result of detecting the change of the threshold voltage of the non-selected memory cell; and counting means provided for each block including one or a plurality of said memory cells for counting a number of times of selection by which the block is selected for writing or erasing, wherein only when the number of times of selection exceeds a predetermined value, the change of the threshold voltage of the memory cell in said block is detected and the threshold voltage is restored.

14. A semiconductor memory device according to claim 13, further comprising a control circuit for reading count information from said counting means when a mode for detecting the change of the threshold voltage of the non-selected memory cell and restoring the threshold voltage is selected by an external signal or an external command, and for activating said first or second detecting means if the number of times of selection exceeds a predetermined value, and activating said restoring means if the change of the threshold voltage of the non-selected memory cell is detected.

15. A semiconductor memory device according to claim 13, wherein each of said first and second detecting means provides a number of detection levels more than a minimum number thereof necessary for reading information stored in said memory cell and compares said detection levels with the threshold voltage of the memory cell to obtain information stored in said memory cell and information on the change of said threshold voltage.

16. A semiconductor memory device according to claim 13, wherein each of said first and second detecting means provides a plurality of detection levels, of which a number is at least twice a minimum number thereof necessary for reading information stored in said memory cell when obtaining information as to whether the threshold voltage of the non-selected memory cell have changed or not at the time of writing or erasing or a plurality of detection levels of which a number is at least three times a minimum number thereof necessary for reading information stored in said memory cell when obtaining information as to whether the threshold voltage of the non-selected memory cell has changed up or down at the time of writing or erasing, and compares said detection levels with the threshold voltage of each memory cell to obtain information stored in the memory cell and information on the change of the threshold voltage of the memory cell.

* * * * *